(12) United States Patent
Caron et al.

(10) Patent No.: US 11,881,837 B2
(45) Date of Patent: Jan. 23, 2024

(54) ACOUSTIC WAVE DEVICE WITH ACOUSTIC VELOCITY REGIONS

(71) Applicant: Skyworks Solutions, Inc., Irvine, CA (US)

(72) Inventors: Joshua James Caron, Madison, NC (US); Rei Goto, Osaka (JP); Benjamin Paul Abbott, Irvine, CA (US); Hiroyuki Nakamura, Osaka-Fu (JP)

(73) Assignee: Skyworks Solutions, Inc., Irvine, CA (US)

( * ) Notice: Subject to any disclaimer, the term of this patent is extended or adjusted under 35 U.S.C. 154(b) by 412 days.

(21) Appl. No.: 17/099,517

(22) Filed: Nov. 16, 2020

(65) Prior Publication Data

US 2021/0159879 A1 May 27, 2021

Related U.S. Application Data

(60) Provisional application No. 62/938,821, filed on Nov. 21, 2019, provisional application No. 62/938,838, (Continued)

(51) Int. Cl.
*H03H 9/02* (2006.01)
*H03H 9/145* (2006.01)
(Continued)

(52) U.S. Cl.
CPC ......... *H03H 9/02685* (2013.01); *H03F 3/245* (2013.01); *H03H 9/02574* (2013.01); *H03H 9/02834* (2013.01); *H03H 9/02842* (2013.01); *H03H 9/145* (2013.01); *H03H 9/25* (2013.01); *H03H 9/6406* (2013.01); *H03H 9/6483* (2013.01); *H04B 1/40* (2013.01); *H03F 2200/451* (2013.01)

(58) Field of Classification Search
CPC .............. H03F 3/245; H03F 2200/451; H03H 9/02574; H03H 9/02685; H03H 9/02834; H03H 9/02842; H03H 9/145; H03H 9/25; H03H 9/6406; H03H 9/6483; H04B 1/40
See application file for complete search history.

(56) References Cited

U.S. PATENT DOCUMENTS 9,673,779 B2 6/2017 Ruile et al.
10,355,668 B2 7/2019 Iwaki et al.
(Continued)

*Primary Examiner* — Quan Tra
(74) *Attorney, Agent, or Firm* — Knobbe, Martens, Olson & Bear, LLP

(57) ABSTRACT

Aspects of this disclosure relate to a surface acoustic wave device with a vertical stack over a piezoelectric layer. The vertical stack can include a first acoustic reflector disposed on the piezoelectric layer, a second acoustic reflector disposed on the piezoelectric layer, and an interdigital transducer electrode disposed on the piezoelectric layer and positioned between the first acoustic reflector and the second acoustic reflector. The interdigital transducer electrode has a first side that is closer to the first acoustic reflector and a second side that is closer to the second acoustic reflector. A vertical arrangement of the vertical stack can be configured such that an acoustic wave propagation velocity of a first region between the first side and a first reflector is faster than an acoustic wave propagation velocity of a second region between the first side and the second side.

20 Claims, 21 Drawing Sheets

Related U.S. Application Data filed on Nov. 21, 2019, provisional application No. 62/938,782, filed on Nov. 21, 2019.

(51) Int. Cl.
  *H03H 9/64* (2006.01)
  *H03F 3/24* (2006.01)
  *H04B 1/40* (2015.01)
  *H03H 9/25* (2006.01)

(56) References Cited

U.S. PATENT DOCUMENTS

| | | | |
|---|---|---|---|
| 10,361,678 B2 | 7/2019 | Iwaki et al. | |
| 11,177,791 B2 | 11/2021 | Solal et al. | |
| 11,652,466 B2 | 5/2023 | Fujiwara | |
| 2014/0285287 A1* | 9/2014 | Komatsu | H03H 9/02858 333/195 |
| 2016/0182009 A1* | 6/2016 | Bhattacharjee | H03H 9/02275 310/313 R |
| 2021/0159879 A1 | 5/2021 | Caron et al. | |
| 2021/0159880 A1* | 5/2021 | Caron | H03H 9/6436 |
| 2021/0159881 A1* | 5/2021 | Caron | H04B 1/40 |

* cited by examiner

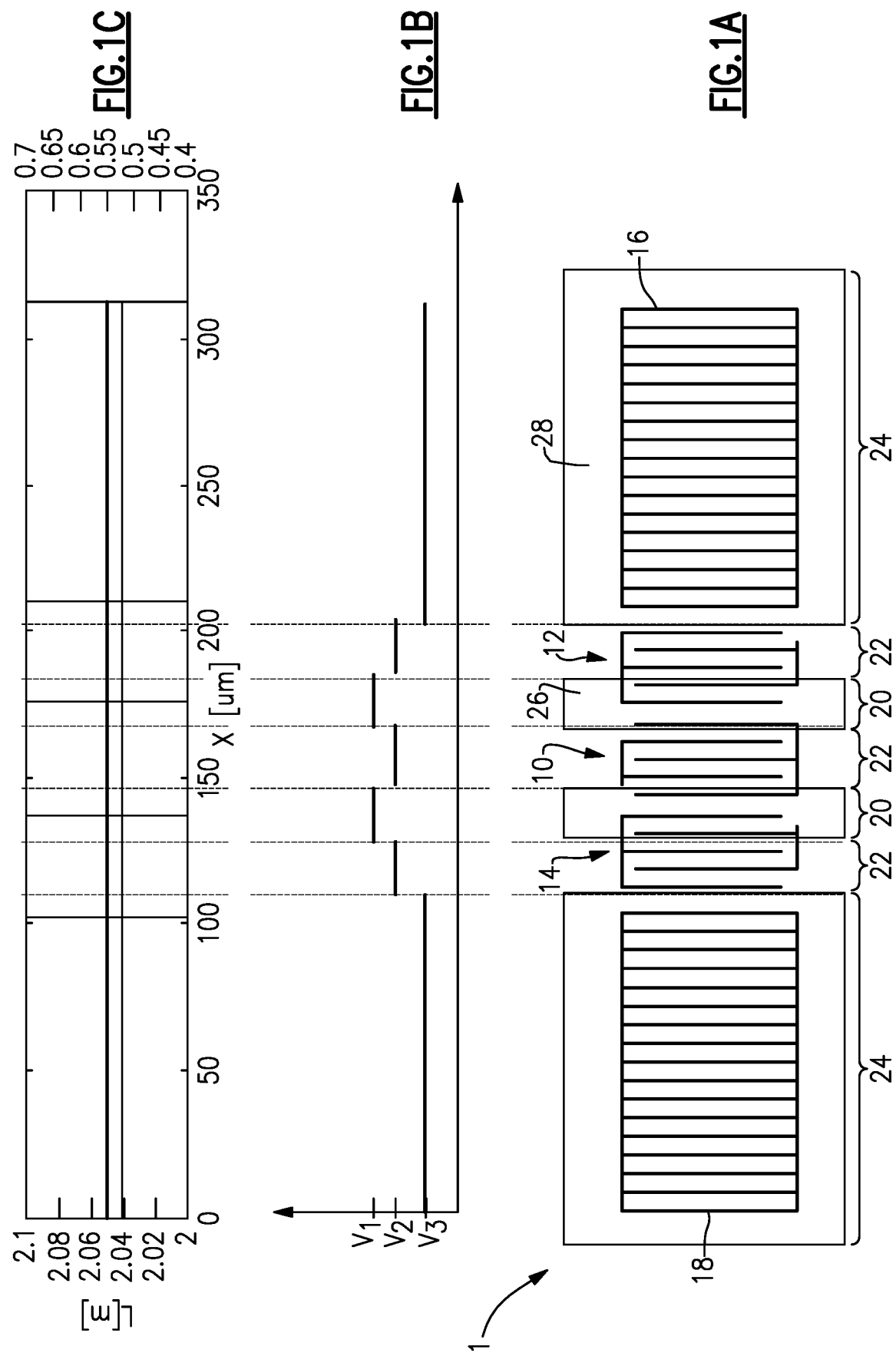

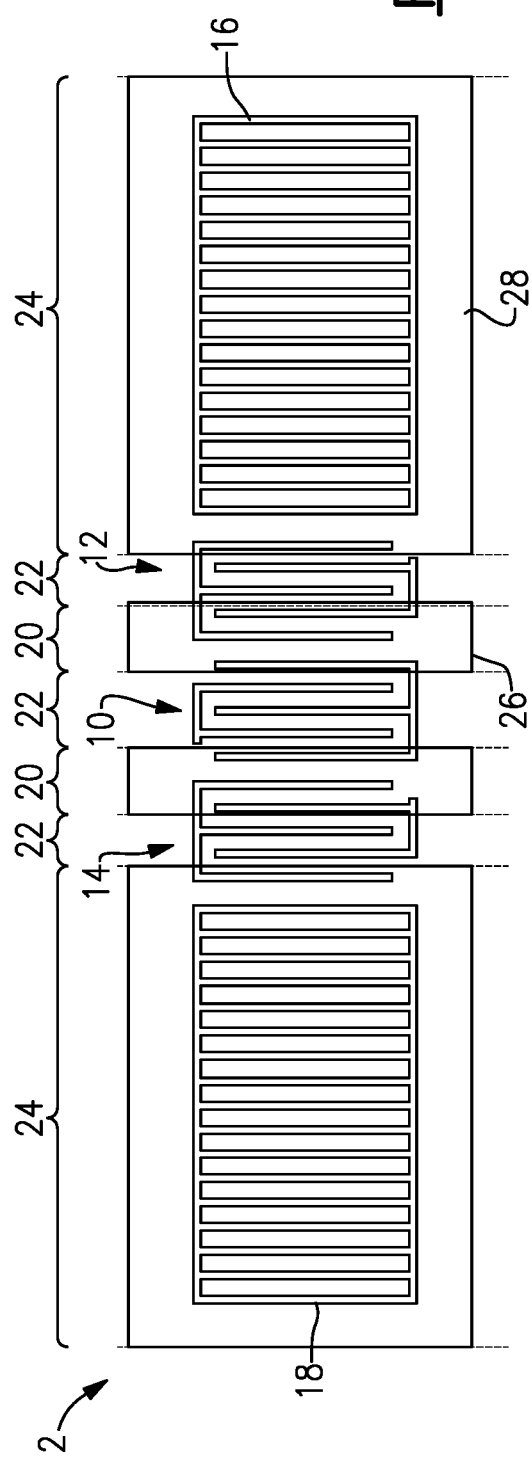
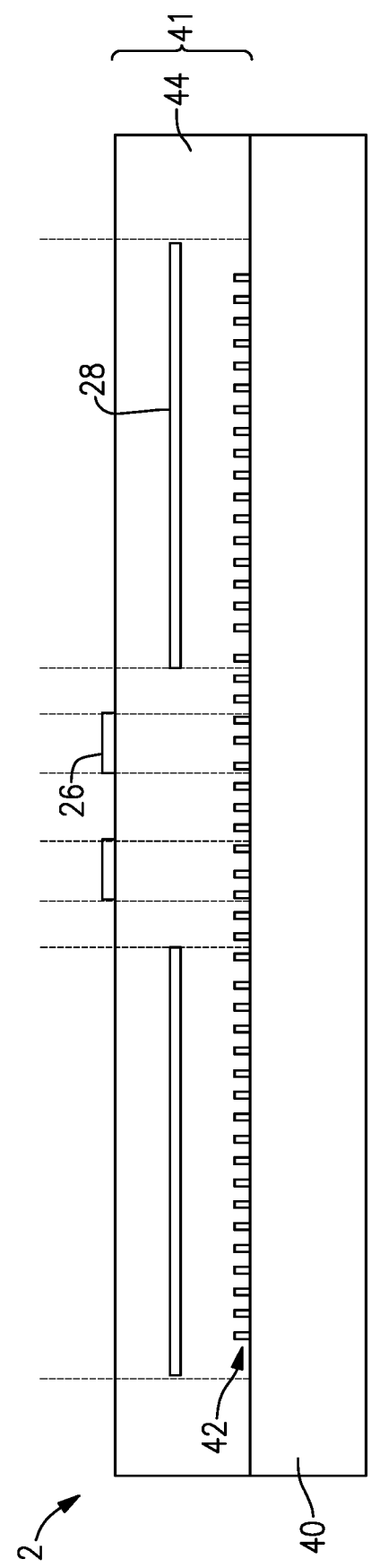

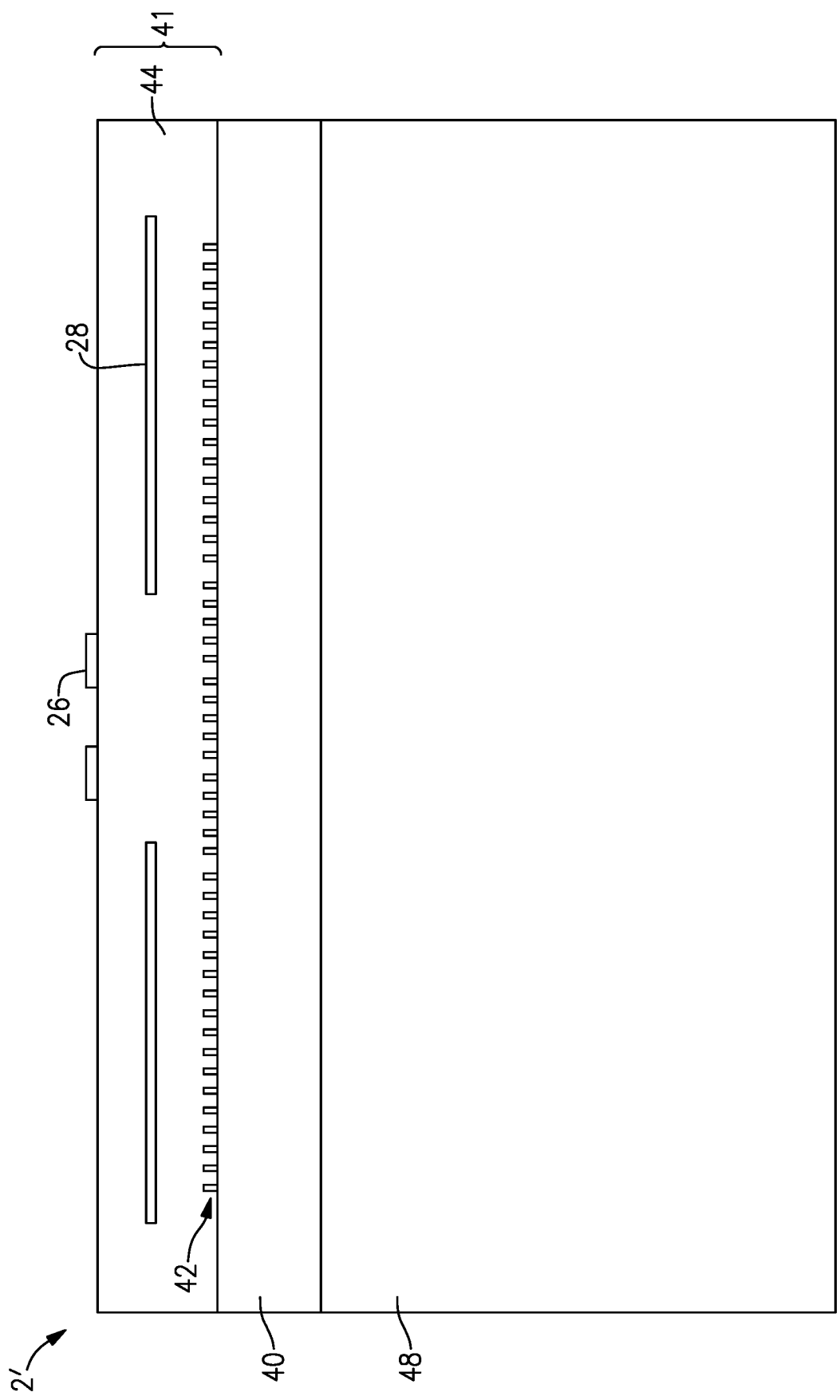

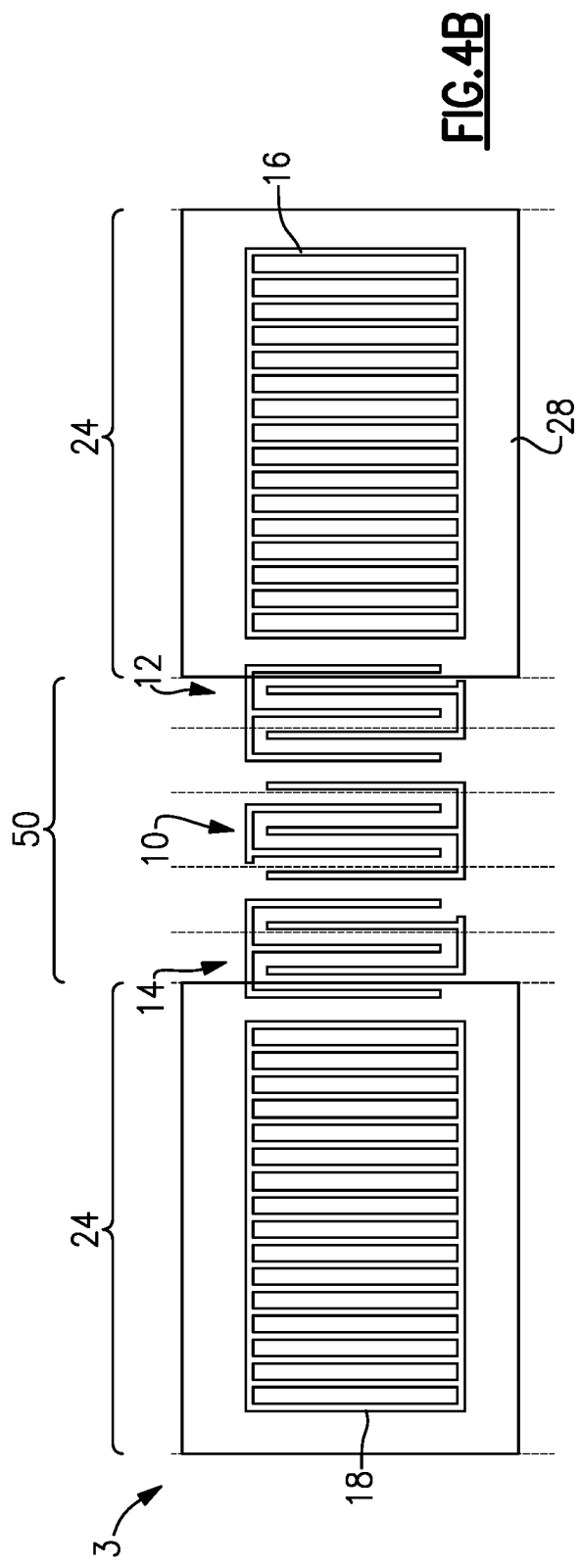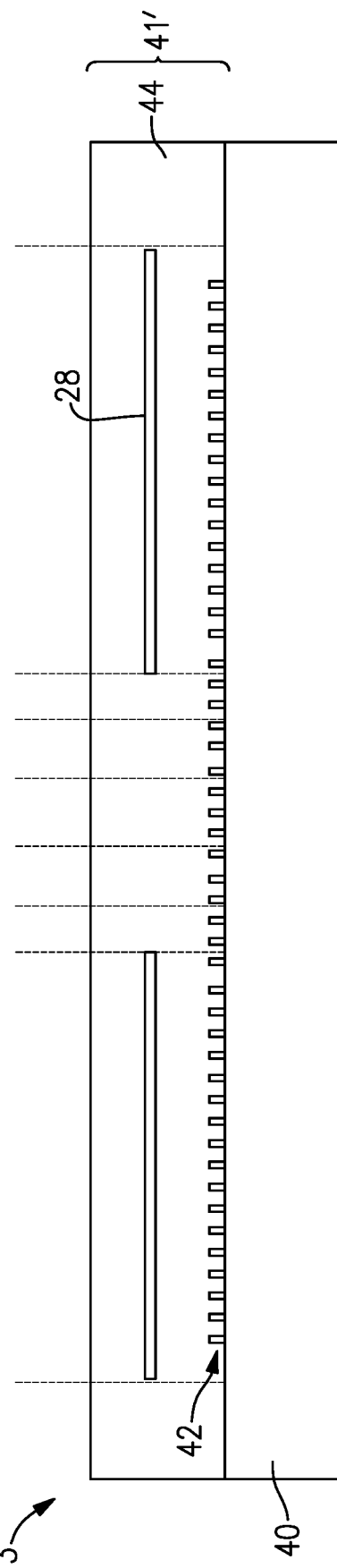

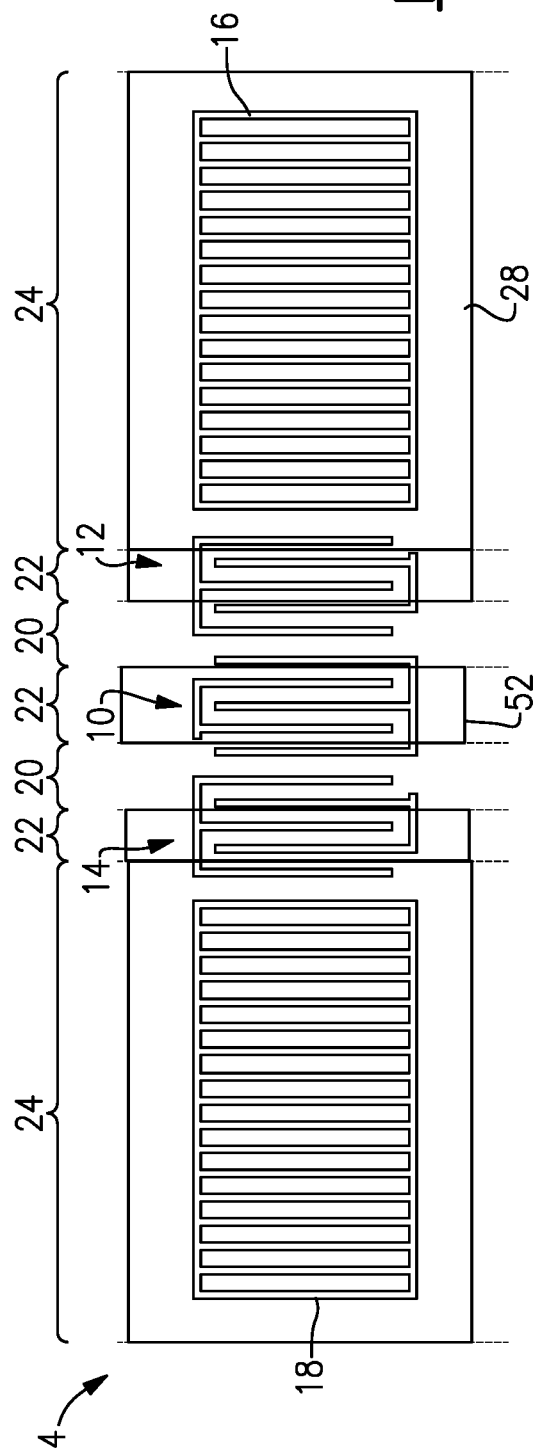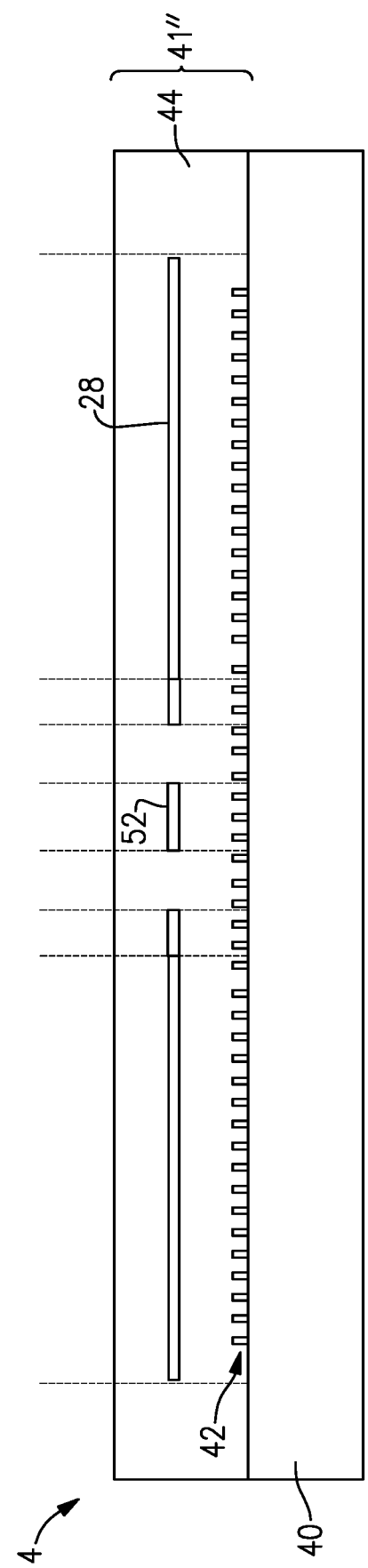

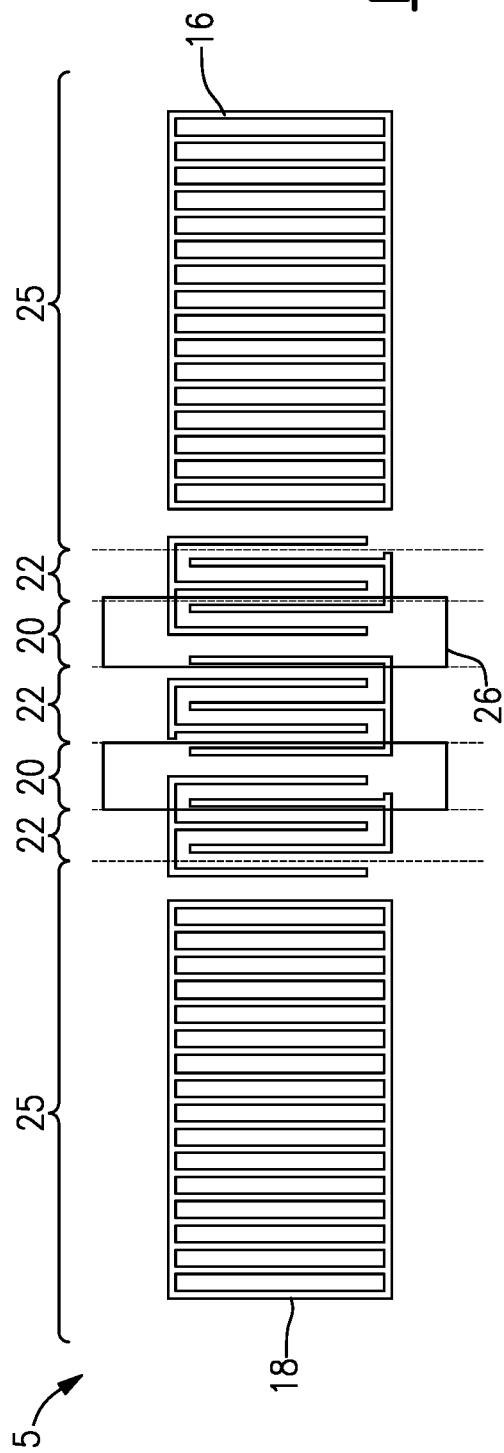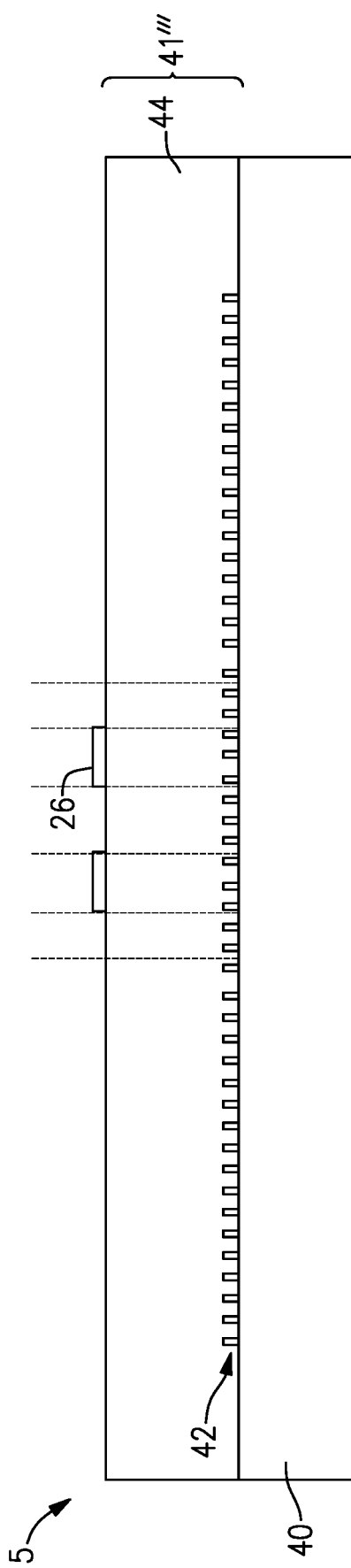

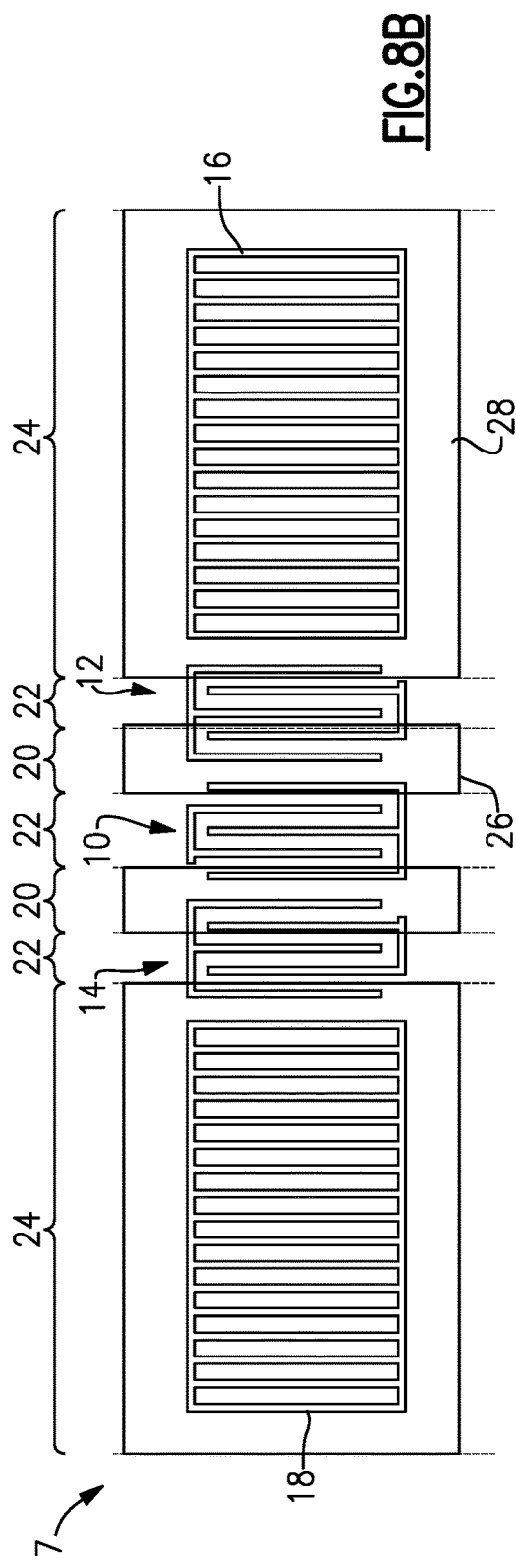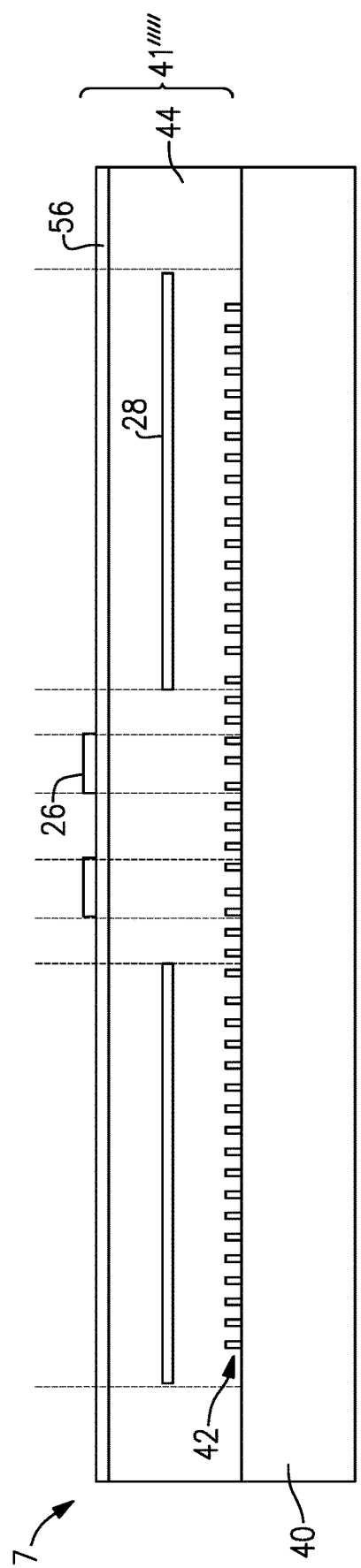

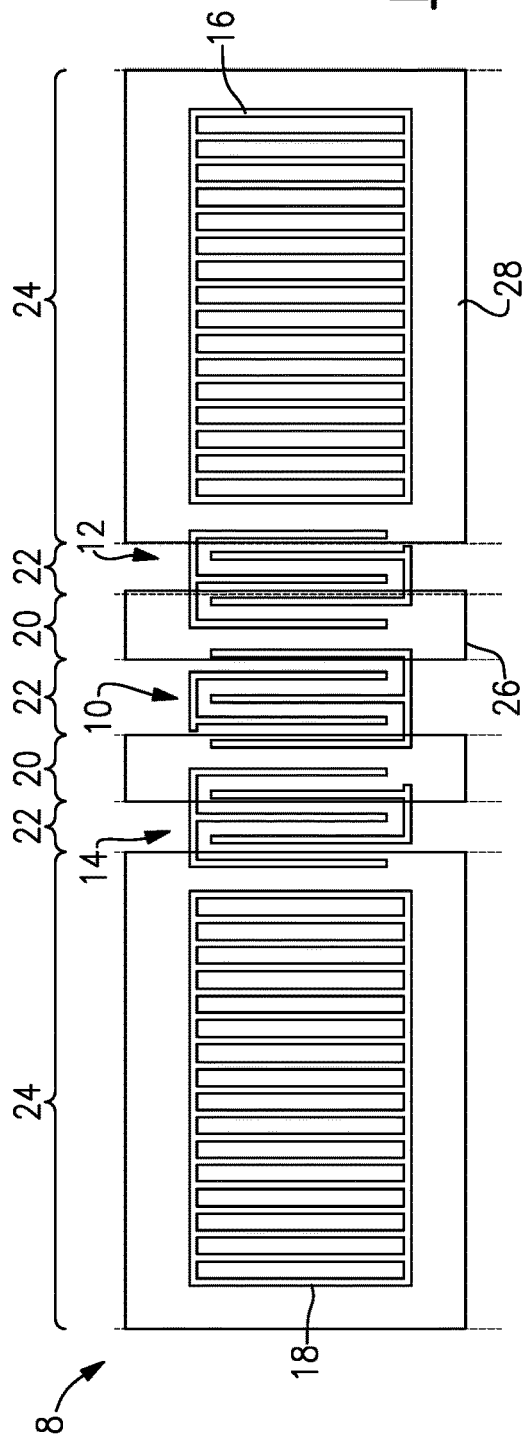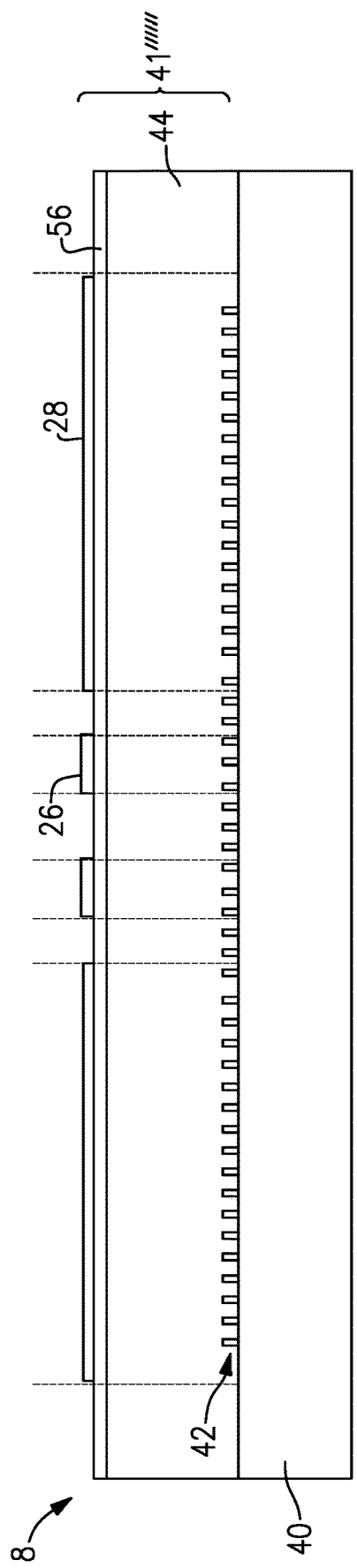

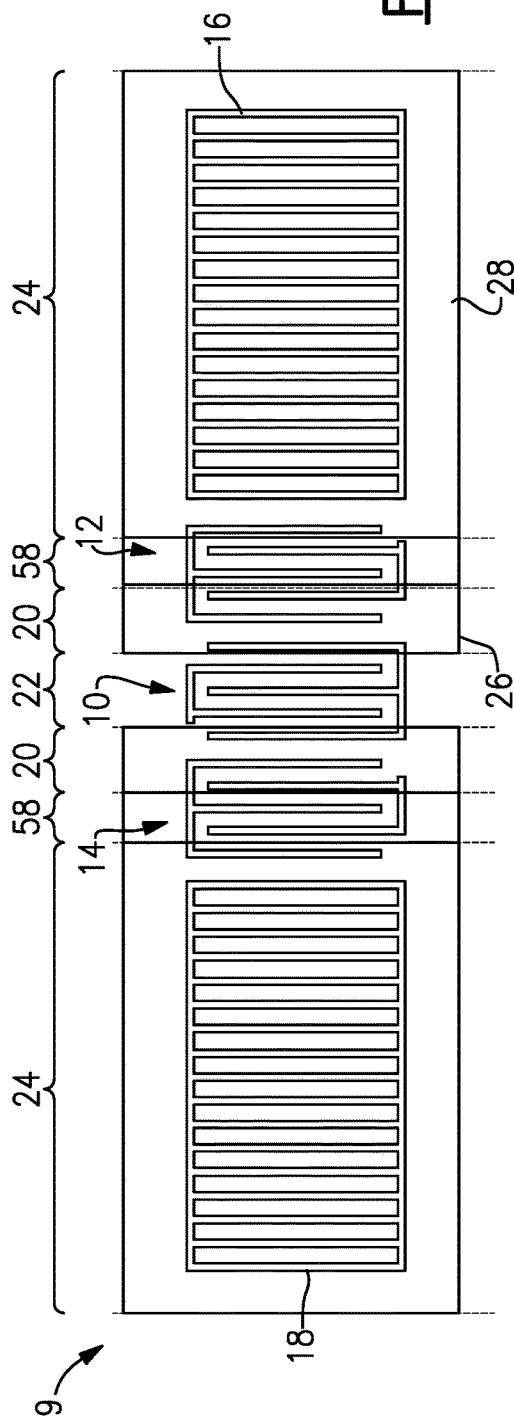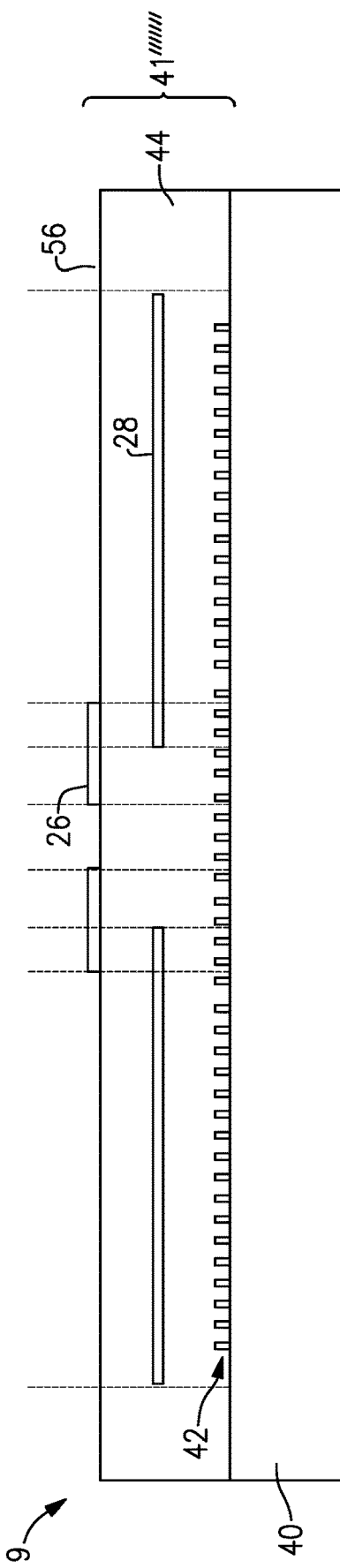

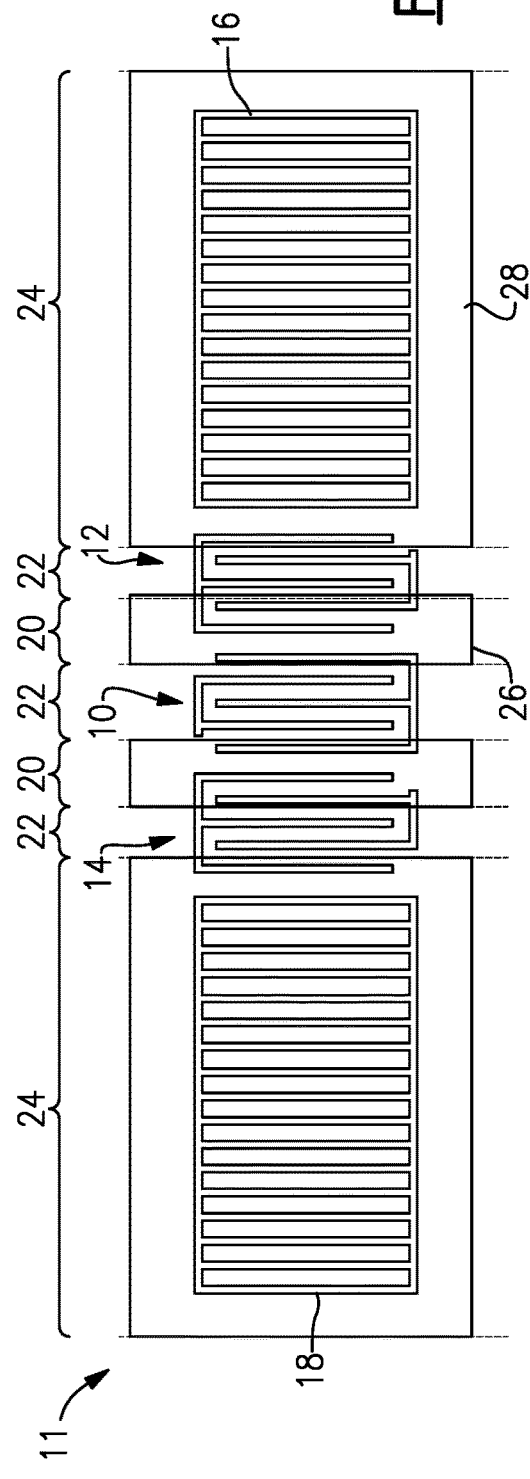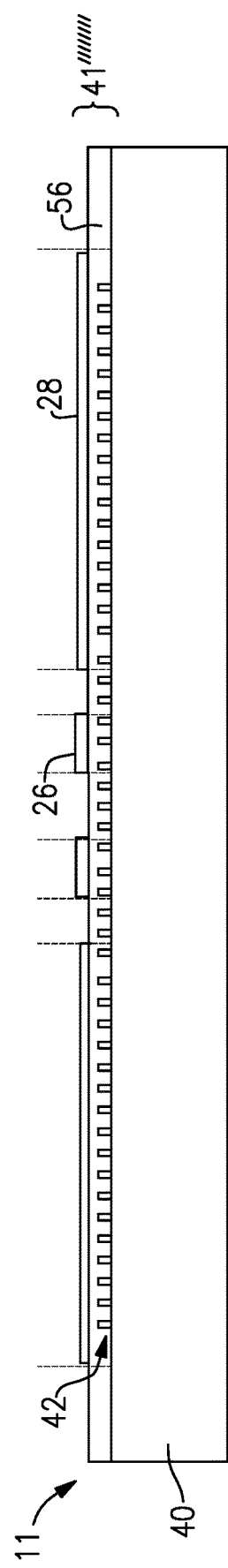

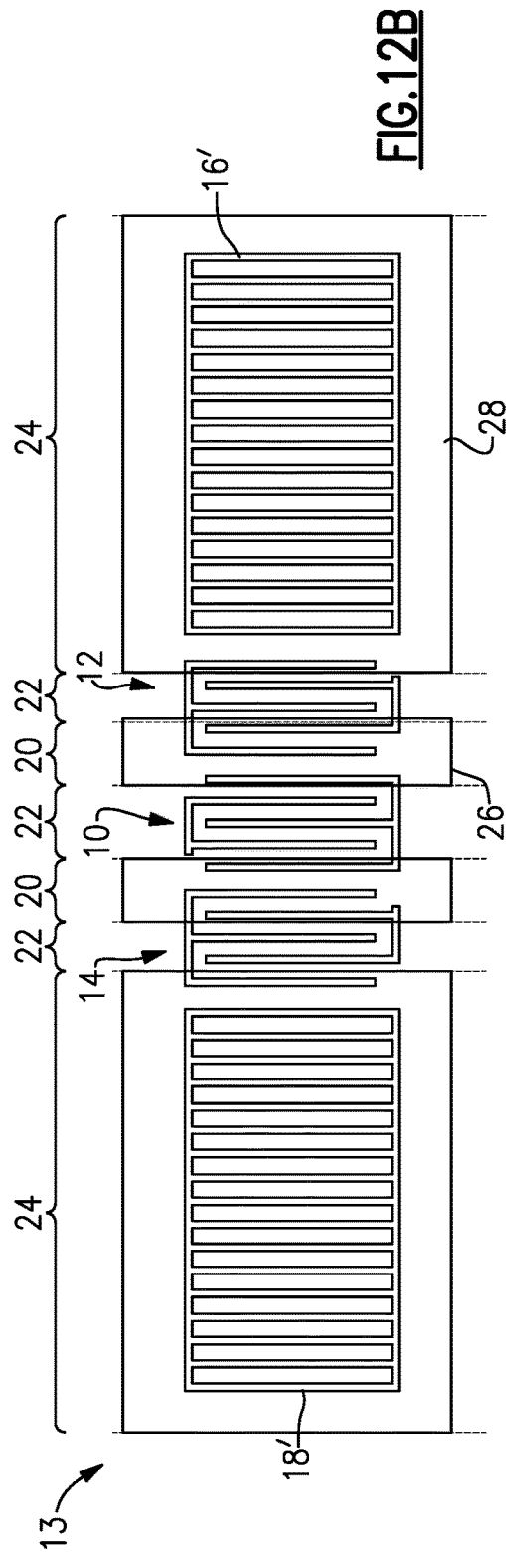
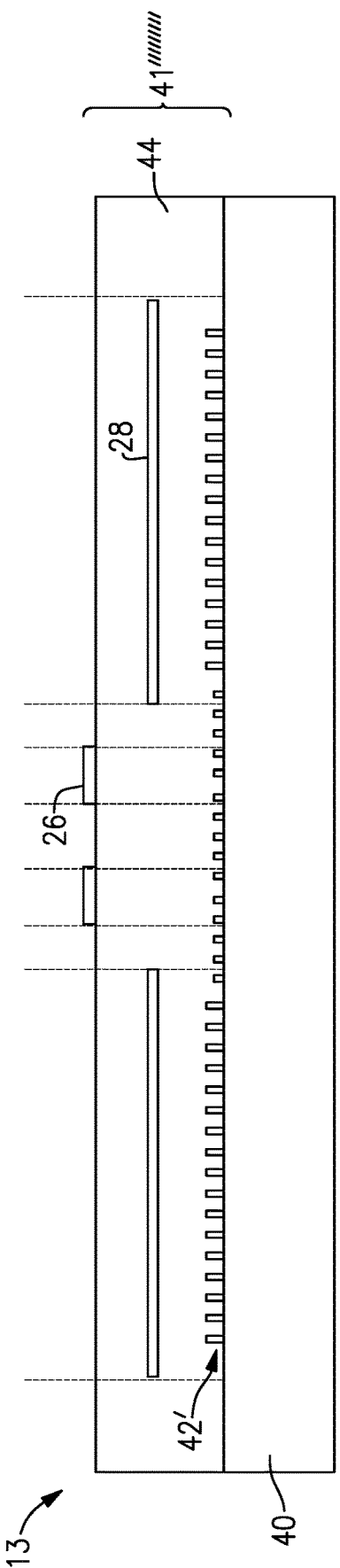

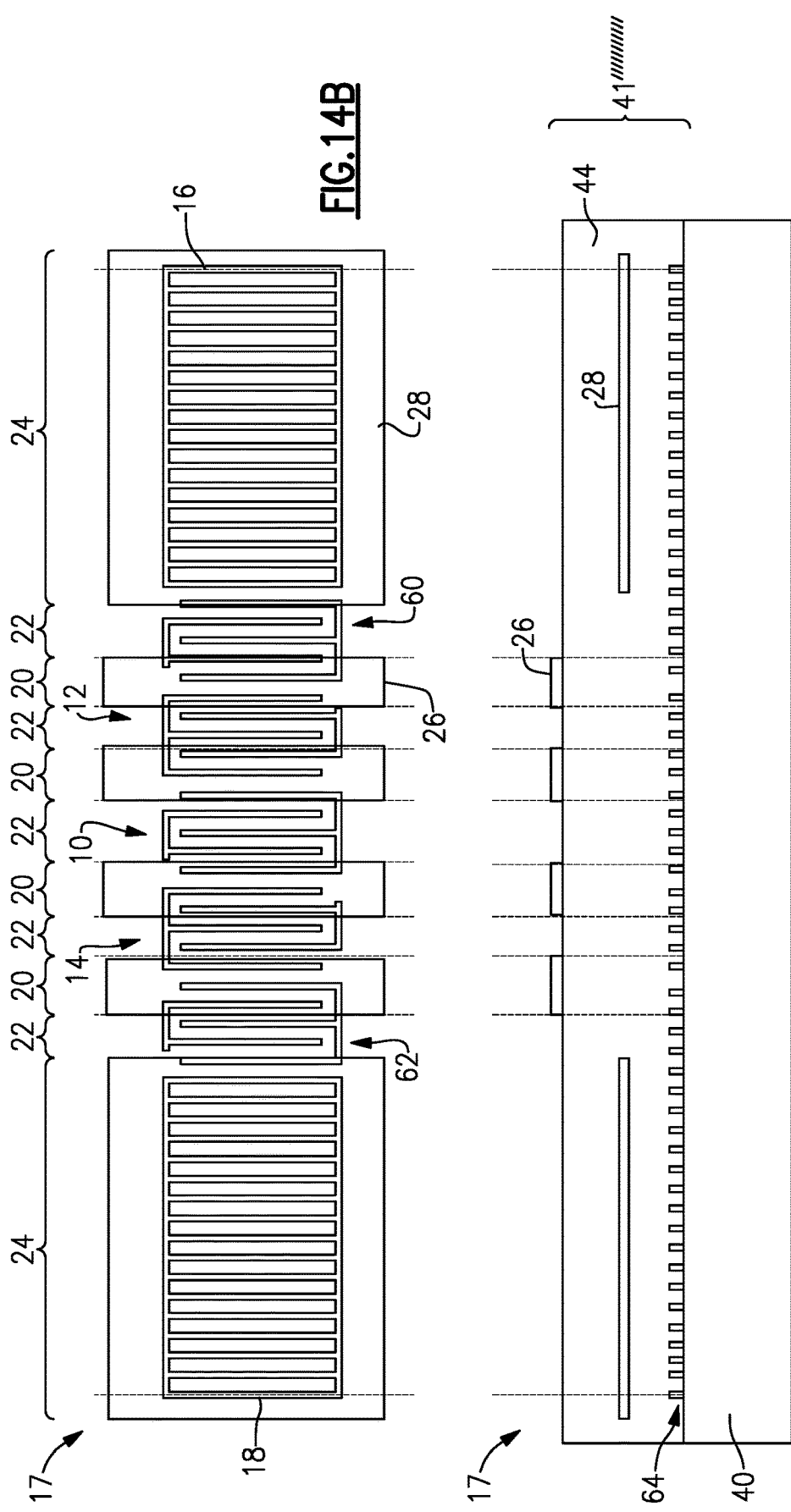

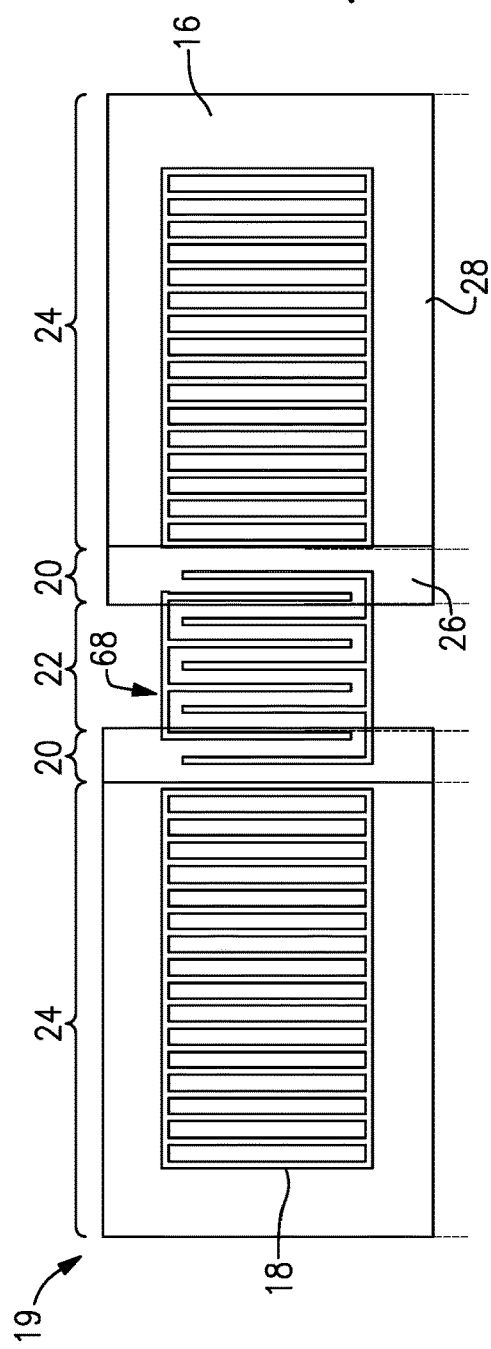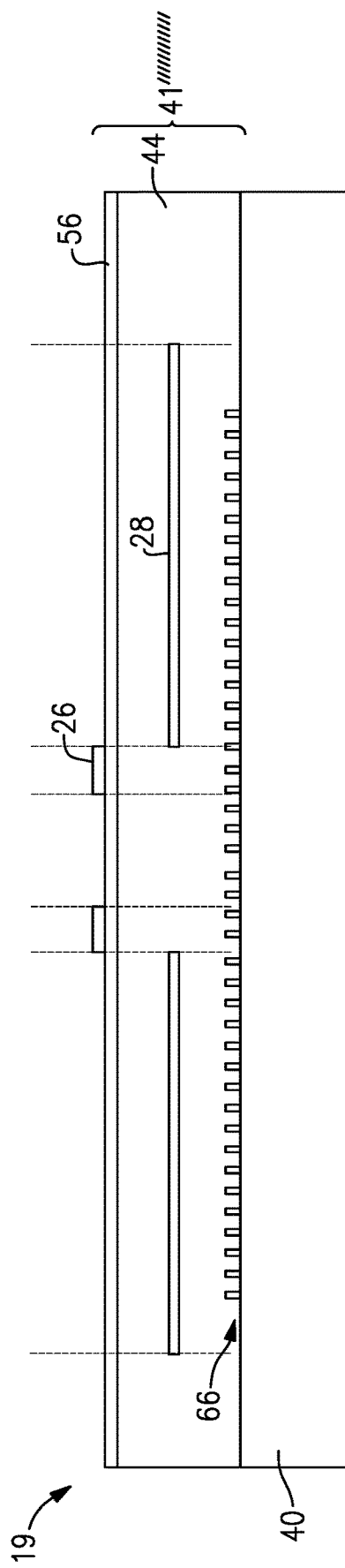

ACOUSTIC WAVE DEVICE WITH ACOUSTIC VELOCITY REGIONS

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 62/938,821, filed Nov. 21, 2019, titled "ACOUSTIC WAVE FILTER WITH ACOUSTIC VELOCITY ADJUSTMENT STRUCTURE," U.S. Provisional Patent Application No. 62/938,838, filed Nov. 21, 2019, titled "ACOUSTIC WAVE DEVICE WITH ACOUSTIC VELOCITY REGIONS," and U.S. Provisional Patent Application No. 62/938,782, filed Nov. 21, 2019, titled "ACOUSTIC WAVE DEVICE WITH VELOCITY ADJUSTMENT LAYER," are hereby incorporated by reference under 37 CFR 1.57 in their entirety.

BACKGROUND

Technical Field

Embodiments of this disclosure relate to acoustic wave devices and/or acoustic wave filters with an acoustic velocity adjustment structure.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. A multi-mode SAW filter can include a plurality of longitudinally coupled interdigital transducer electrodes positioned between acoustic reflectors.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

SUMMARY

The innovations described in the claims each have several aspects, no single one of which is solely responsible for its desirable attributes. Without limiting the scope of the claims, some prominent features of this disclosure will now be briefly described.

In one aspect, a multi-mode surface acoustic wave filter is disclosed. The multi-mode surface acoustic wave filter can include a first interdigital transducer electrode positioned on a piezoelectric layer, an acoustic reflector positioned on the piezoelectric layer, a second interdigital transducer electrode positioned on the piezoelectric layer, and an acoustic velocity adjustment structure positioned over at least a gap between the first interdigital transducer electrode and the second interdigital transducer electrode. The second interdigital transducer electrode is longitudinally coupled to the first interdigital transducer electrode and positioned between the first interdigital transducer electrode and the acoustic reflector. The acoustic velocity adjustment structure is arranged to increase an acoustic wave propagation velocity in a first region that includes the gap relative to a second region over at least a portion of the first interdigital transducer electrode.

In one embodiment, the acoustic velocity adjustment structure includes a high speed layer over the first region to increase the acoustic wave propagation velocity in the first region. The high speed layer can include a silicon nitride layer. The high speed layer can include an aluminum oxide layer.

In one embodiment, the multi-mode surface acoustic wave filter further includes a temperature compensation layer over the piezoelectric layer. The acoustic velocity adjustment structure can be at least partially embedded in the temperature compensation layer. The acoustic velocity adjustment structure can be at least partially disposed on the temperature compensation layer.

In one embodiment, the second region includes a first sub-region and a second sub-region. The first sub-region can be defined over at least the portion of the first interdigital transducer electrode. The second sub-region can be defined over at least a portion of the second interdigital transducer electrode. The acoustic wave propagation velocity in the first sub-region and the acoustic wave propagation velocity in the second sub-region can be approximately the same.

In one embodiment, the multi-mode surface acoustic wave filter further includes a third region over at least a portion of the acoustic reflector. The acoustic velocity adjustment structure can include a low speed layer over the third region. The low speed layer can be configured to decrease the acoustic wave propagation velocity in the third region relative to the second region.

In one embodiment, the multi-mode surface acoustic wave filter further includes a third interdigital transducer electrode longitudinally coupled to the first interdigital transducer electrode such that the first interdigital transducer electrode is positioned between the third interdigital transducer electrode and the second interdigital transducer electrode. The multi-mode surface acoustic wave filter can further include a second acoustic reflector that is longitudinally arranged such that the third interdigital transducer electrode is positioned between the second acoustic reflector and the first interdigital transducer electrode.

In one embodiment, the first interdigital transducer electrode and the second interdigital transducer electrode each has substantially uniform pitch. The first interdigital transducer electrode and the second interdigital transducer electrode can have a pitch variation of no greater than 10 percent. The first interdigital transducer electrode and the second interdigital transducer electrode can have a pitch variation of no greater than 5 percent.

In one embodiment, the multi-mode surface acoustic wave filter further includes a support substrate on which the piezoelectric layer is positioned.

In one embodiment, the first region includes a portion of the first interdigital transducer electrode. The portion of the first interdigital transducer electrode can be less than one third of a length of the first interdigital transducer electrode along a direction perpendicular to an aperture direction.

In one aspect, a radio frequency module is disclosed. The radio frequency module can include a filter that includes any multi-mode surface acoustic wave filter disclosed herein, and a radio frequency circuit element that is coupled to the filter. The filter and the radio frequency circuit element are enclosed within a common module package.

In one embodiment, the radio frequency circuit element is a radio frequency amplifier arranged to amplify a radio frequency signal.

In one embodiment, the radio frequency circuit element is a switch configured to selectively couple the filter to a port of the radio frequency module.

In one aspect, a wireless communication device is disclosed. The wireless communication device can include a filter that include any multi-mode surface acoustic wave filter disclosed herein, an antenna that is operatively coupled to the filter, a radio frequency amplifier that is operatively coupled to the multi-mode surface acoustic wave filter and a transceiver in communication with the radio frequency amplifier. The radio frequency amplifier is configured to amplify a radio frequency signal In one embodiment, the wireless communication device further includes a baseband processor in communication with the transceiver.

In one embodiment, the filter is included in a radio frequency front end.

In one embodiment, the filter is included in a diversity receive module.

In one aspect, a method of filtering a radio frequency signal is disclosed. The method can include receiving a radio frequency signal at a port of a filter that includes any multi-mode surface acoustic wave filter disclosed herein, and filtering the radio frequency signal with the filter.

In one aspect, a surface acoustic wave device is disclosed. The surface acoustic wave device can include a piezoelectric layer and a vertical stack positioned over the piezoelectric layer. The vertical stack includes a first acoustic reflector positioned on the piezoelectric layer, a second acoustic reflector positioned on the piezoelectric layer, and an interdigital transducer electrode positioned on the piezoelectric layer and positioned between the first acoustic reflector and the second acoustic reflector. The interdigital transducer electrode has a first side closer to the first acoustic reflector and a second side closer to the second acoustic reflector. A vertical arrangement of the vertical stack is configured such that an acoustic wave propagation velocity of a first region between the first side and a first reflector is faster than an acoustic wave propagation velocity of a second region between the first side and the second side.

In one embodiment, the vertical stack includes a high speed layer over the first region. The vertical stack can include a temperature compensation layer between a portion of the piezoelectric layer and the high speed layer. The high speed layer can include a silicon nitride layer. The high speed layer can include an aluminum oxide layer.

In one embodiment, the vertical stack includes a low speed layer with a trench over the first region.

In one embodiment, the surface acoustic wave device further includes a second interdigital transducer electrode that is positioned between the first side and the first reflector. The second interdigital transducer electrode can be longitudinally coupled to the first interdigital transducer electrode. The surface acoustic wave device can further include a third interdigital transducer electrode positioned between the second side and the second reflector, the third interdigital transducer electrode being longitudinally coupled to the second interdigital transducer electrode. The second region can be in between the first side and the second interdigital transducer electrode. The second region can overlap at least a portion of the second interdigital transducer electrode.

In one embodiment, the second region overlaps at least a portion of the interdigital transducer electrode.

In one embodiment, an acoustic wave propagation velocity of a third region over the first acoustic reflector is slower than the first region. The vertical stack can include a low speed layer positioned over the first acoustic reflector in the third region, the low speed layer configured to decrease the acoustic wave propagation velocity in the third region. The low speed layer can be a metal layer. The metal layer can include at least one of a molybdenum layer, a copper layer, a tungsten layer, a titanium layer, a silver layer, a gold layer, a ruthenium layer, or a platinum layer. The low speed layer can be a dielectric layer. The dielectric layer can include at least one of tantalum oxide layer or a tellurium dioxide layer.

In one embodiment, the vertical stack includes a high speed layer that is positioned over at least a portion of the interdigital transducer electrode in a third region between the second side and the second acoustic reflector. The high speed layer can be configured to increase the acoustic wave propagation velocity in the second region. The high speed layer can include at least one of a silicon nitride layer, silicon oxynitride layer, or aluminum oxide layer. The vertical stack can include a temperature compensation layer between a portion of the interdigital transducer electrode structure and the high speed layer. The vertical stack can include a temperature compensation layer positioned over the first interdigital transducer electrode.

In one embodiment, the surface acoustic wave device is arranged as a multi-mode surface acoustic wave filter.

In one embodiment, the surface acoustic wave device is arranged as a surface acoustic wave resonator.

In one embodiment, the first acoustic reflector, the second acoustic reflector, and the interdigital transducer electrode each has substantially uniform pitch. The first acoustic reflector, the second acoustic reflector, and the interdigital transducer electrode can have a pitch variation of no greater than 10 percent. The first acoustic reflector, the second acoustic reflector, and the interdigital transducer electrode can have a pitch variation of no greater than 5 percent.

In one aspect, a radio frequency module is disclosed. the radio frequency module can include a filter that includes any surface acoustic wave device disclosed herein and a radio frequency circuit element coupled to the filter. The filter and the radio frequency circuit element can be enclosed within a common module package.

In one embodiment, the radio frequency circuit element is a radio frequency amplifier arranged to amplify a radio frequency signal.

In one embodiment, the radio frequency circuit element is a switch configured to selectively couple the filter to a port of the radio frequency module.

In one aspect, a wireless communication device is disclosed. the wireless communication device can include a filter that include any surface acoustic wave device disclosed herein, an antenna operatively that is coupled to the filter, a radio frequency amplifier operatively that is coupled to the acoustic wave filter and configured to amplify a radio frequency signal, and a transceiver that is in communication with the radio frequency amplifier.

In one embodiment, the wireless communication device further includes a baseband processor in communication with the transceiver.

In one embodiment, the filter is included in a radio frequency front end.

In one embodiment, the filter is included in a diversity receive module.

In one aspect, a method of filtering a radio frequency signal is disclosed. the method can include receiving a radio frequency signal at a port of a filter that includes any surface acoustic wave device disclosed herein and filtering the radio frequency signal with the filter.

In one aspect, a surface acoustic wave device is disclosed. The surface acoustic wave device can include a piezoelectric layer, a first reflector positioned over the piezoelectric layer, a second reflector positioned over the piezoelectric layer, an interdigital transducer electrode structure positioned over the piezoelectric layer and positioned between the first reflector and the second reflector, and a high speed layer positioned over at least a portion between the first side and the first reflector. The interdigital transducer structure having a first side closer to the first reflector and a second side closer to the second reflector. The high speed layer in positioned such that an acoustic wave propagation velocity in a fast region overlapping the high speed layer is greater than an acoustic wave propagation velocity a region between the first side and the second side.

In one embodiment, the surface acoustic wave device further includes a low speed layer positioned over the first reflector such that an acoustic wave propagation velocity in a slow region over the first reflector is slower than in the fast region overlapping the high speed layer and the region between the first side and the second side. The low speed layer and the first reflector can be spaced apart by a temperature compensation layer. A portion of the high speed layer and a portion of the low speed layer can vertically overlap.

In one embodiment, the surface acoustic wave device is arranged as a multi-mode surface acoustic wave filter. The interdigital transducer electrode structure can have a pitch variation of less than 10 percent.

In one embodiment, the surface acoustic wave device is a surface acoustic wave resonator.

In one aspect, a surface acoustic wave device is disclosed. The surface acoustic wave device can include a piezoelectric layer, a first reflector positioned over the piezoelectric layer, a second reflector positioned over the piezoelectric layer, an interdigital transducer electrode structure positioned over the piezoelectric layer and positioned between the first reflector and the second reflector, a low speed layer positioned in a slow region over the first reflector. The interdigital transducer structure has a first side closer to the first reflector and a second side closer to the second reflector. The low speed layer is positioned such that an acoustic wave propagation velocity of the slow region is slower than an acoustic wave propagation velocity of a region between the first side and the second side.

In one embodiment, the surface acoustic wave device further includes a temperature compensation layer over the interdigital transducer electrode, the first reflector, and the second reflector. The low speed layer and the first reflector can be spaced apart by the temperature compensation layer.

In one embodiment, the surface acoustic wave device is arranged as a multi-mode surface acoustic wave filter. The interdigital transducer electrode structure can have a pitch variation of less than 10 percent.

In one embodiment, the surface acoustic wave device is a surface acoustic wave resonator.

In one aspect, a radio frequency module is disclosed. the radio frequency module can include a filter that includes any surface acoustic wave device disclosed herein and a radio frequency circuit element that is coupled to the filter. The filter and the radio frequency circuit element are enclosed within a common module package.

In one embodiment, the radio frequency circuit element is a radio frequency amplifier arranged to amplify a radio frequency signal.

In one embodiment, the radio frequency circuit element is a switch configured to selectively couple the filter to a port of the radio frequency module.

In one aspect, a wireless communication device is disclosed. The wireless communication device can include a filter that includes any surface acoustic wave device disclosed herein, an antenna that is operatively coupled to the filter, a radio frequency amplifier that is operatively coupled to the acoustic wave filter and configured to amplify a radio frequency signal, and a transceiver that is in communication with the radio frequency amplifier.

In one embodiment, the wireless communication device further includes a baseband processor in communication with the transceiver.

In one embodiment, the filter is included in a radio frequency front end.

In one embodiment, the filter is included in a diversity receive module.

In one aspect, a method of filtering a radio frequency signal is disclosed. The method can include receiving a radio frequency signal at a port of a filter that includes any surface acoustic wave device disclosed herein and filtering the radio frequency signal with the filter.

The present disclosure relates to U.S. patent application Ser. No. 17/099,522, titled "ACOUSTIC WAVE FILTER WITH ACOUSTIC VELOCITY ADJUSTMENT STRUCTURE," filed on Nov. 16, 2022, the entire disclosure of which is hereby incorporated by reference herein. The present disclosure relates to U.S. patent application Ser. No. 17/099,603, titled "ACOUSTIC WAVE DEVICE WITH VELOCITY ADJUSTMENT LAYER" filed on Nov. 16, 2022, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 1A illustrates a top plan view of a multimode longitudinally coupled surface acoustic wave (SAW) structure according to one embodiment.

FIG. 1B illustrates a velocity profile of the SAW structure shown in FIG. 1A.

FIG. 1C illustrates a pitch profile of the SAW structure shown in FIG. 1A.

FIG. 3A illustrates a cross section of a multimode longitudinally coupled SAW structure according to one embodiment.

FIG. 3B illustrates a top plan view of the SAW structure illustrated in FIG. 3A.

FIG. 3C illustrates a cross section of a multimode longitudinally coupled SAW structure according to one embodiment.

FIG. 4A illustrates a cross section of a multimode longitudinally coupled SAW structure according to one embodiment.

FIG. 4B illustrates a top plan view of the SAW structure illustrated in FIG. 4A.

FIG. 5A illustrates a cross section of a multimode longitudinally coupled SAW structure according to one embodiment.

FIG. 5B illustrates a top plan view of the SAW structure illustrated in FIG. 5A.

FIG. 6A illustrates a cross section of a multimode longitudinally coupled SAW structure according to one embodiment.

FIG. 6B illustrates a top plan view of the SAW structure illustrated in FIG. 6A.

FIG. 8A illustrates a cross section of a multimode longitudinally coupled SAW structure according to one embodiment.

FIG. 8B illustrates a top plan view of the SAW structure illustrated in FIG. 8A.

FIG. 9A illustrates a cross section of a multimode longitudinally coupled SAW structure according to one embodiment.

FIG. 9B illustrates a top plan view of the SAW structure illustrated in FIG. 9A.

FIG. 10A illustrates a cross section of a multimode longitudinally coupled SAW structure according to one embodiment.

FIG. 10B illustrates a top plan view of the SAW structure illustrated in FIG. 10A.

FIG. 11A illustrates a cross section of a multimode longitudinally coupled SAW structure according to one embodiment.

FIG. 11B illustrates a top plan view of the SAW structure illustrated in FIG. 11A.

FIG. 12A illustrates a cross section of a multimode longitudinally coupled SAW structure according to one embodiment.

FIG. 12B illustrates a top plan view of the SAW structure illustrated in FIG. 12A.

FIG. 14A illustrates a cross section of a multimode longitudinally coupled SAW structure according to one embodiment.

FIG. 14B illustrates a top plan view of the SAW structure illustrated in FIG. 14A.

FIG. 15A illustrates a cross section of a ladder SAW structure according to one embodiment.

FIG. 15B illustrates a top plan view of the SAW structure illustrated in FIG. 15A.

DETAILED DESCRIPTION OF CERTAIN EMBODIMENTS

Figure 2A:
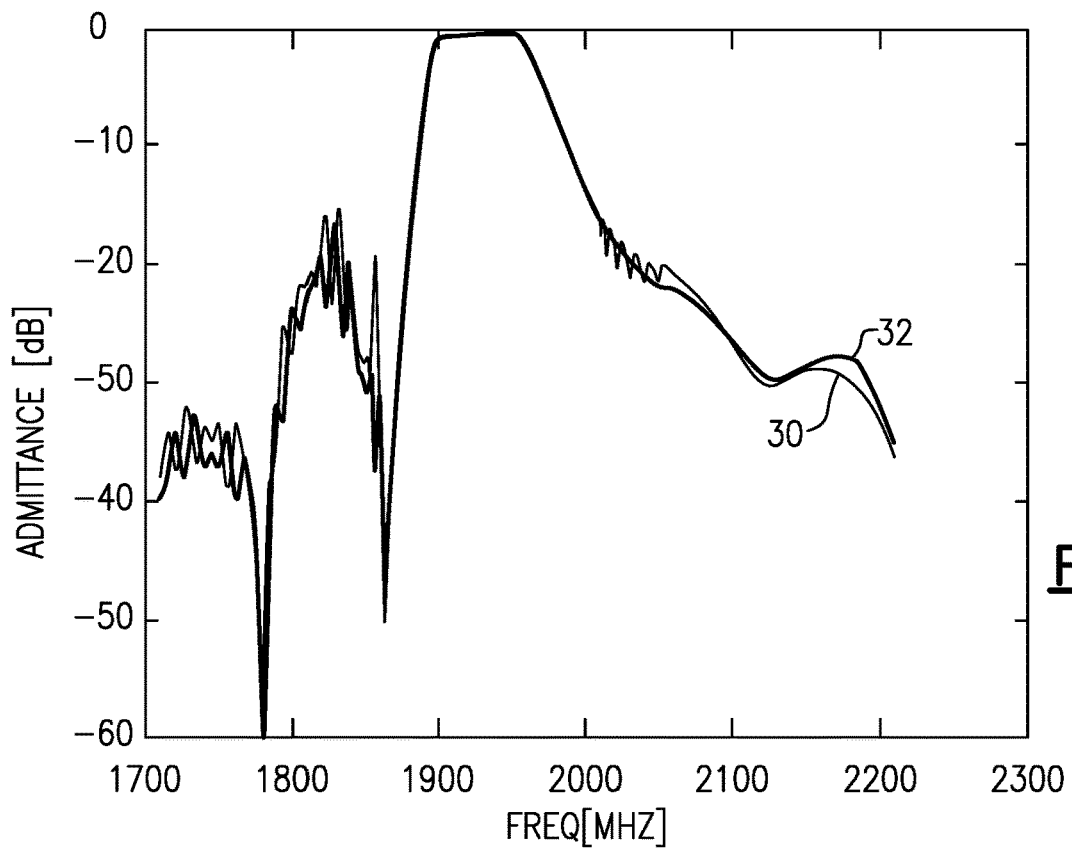
FIG. 2A is a graph that illustrates simulated admittance results of two SAW filters.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. A SAW device can be, for example, a multimode longitudinally coupled SAW filter (e.g., a double mode SAW (DMS) filter) or a SAW resonator.

Multimode SAW (MMS) filters are key structures for meeting certain design specifications for radio frequency (RF) filter components. In order for an MMS filter to provide a desired frequency response for some design specifications, a pitch of an interdigital transducer (IDT) electrode structure can be modulated such that fingers of the IDT structure are unevenly spaced. However, in some applications, such an MMS filter with varying and/or uneven IDT electrode pitch can lead to radiation losses, for example, due to discontinuity and/or process limitations for relatively high frequency filter devices. The loss mechanism due to aperiodicity of IDT electrode fingers can be difficult to quantify and/or model. Further, there may be manufacturing difficulties for manufacturing a SAW device with varying/uneven pitch. There may be manufacturing limitations to forming narrow pitch IDT electrode fingers in certain manufacturing processes.

Aspects of this disclosure relate to SAW devices (e.g., multimode longitudinally coupled SAW filters and/or SAW resonators) that can reduce and/or eliminate radiation losses. At the same time, such SAW devices can provide a desirable frequency response (e.g., a relatively high quality factor (Q) and/or a reduced bulk radiation). Aspects of this disclosure relate to SAW devices that include an acoustic velocity adjustment structure. The acoustic velocity adjustment structure can include a high speed layer that speeds up an acoustic velocity of a surface acoustic wave generated by the SAW device in a region of the SAW device and/or a low speed layer that slows down the acoustic velocity in a region of the SAW device. Positioning of such a velocity adjustment structure can create different velocity regions in a SAW devices.

Creating different velocity regions in a SAW device primarily with a velocity adjustment structure implemented in one or more layers above an IDT electrode can reduce one or more loss mechanisms of the SAW device compared to a similar SAW device that primarily uses aperiodic IDT electrode fingers and/or aperiodic acoustic reflector fingers to create different velocity regions. The velocity adjustment layer can be easier to manufacture than aperiodic IDT electrode fingers. MMS filters disclosed herein can be implemented with less pitch variation than some previous MMS filters. With velocity adjustment structures disclosed herein, MMS filters can filter higher frequency signals with the same IDT electrode line and space process limitations compared to some previous MMS filters.

Embodiments of a SAW filter disclosed herein include a first IDT electrode, a second IDT electrode longitudinally coupled to the first IDT electrode, and an acoustic reflector that are on a piezoelectric layer. The SAW filter also includes an acoustic velocity adjustment structure over at least a gap between the first IDT electrode and the second IDT electrode. This can increase acoustic velocity in a region over the gap. The acoustic velocity adjustment structure can be arranged to change acoustic wave propagation velocity in different regions. The acoustic velocity adjustment structure can include a high speed layer and/or a trench in a low speed layer to increase acoustic velocity in a region of the SAW filter. The acoustic velocity adjustment structure can include a low speed layer and/or a trench in a high speed layer to increase acoustic velocity in a region of the SAW filter. Different acoustic velocity regions can alternatively or additionally be implemented by high speed layers that increase acoustic velocity by different magnitudes and/or low speed layers that decrease acoustic velocity by different magnitudes. The acoustic velocity adjustment structure can be included in a vertical stack that is arranged over the piezoelectric layer and one or more of the IDT electrodes.

Certain embodiments disclosed herein relate to multimode longitudinally coupled surface acoustic wave filters. Such filters can be referred to as multimode surface acoustic wave (MMS) filters. MMS filters can include a plurality of IDT electrodes that are longitudinally coupled to each other and positioned between acoustic reflectors. Some MMS filters can be referred to as double mode surface acoustic wave (DMS) filters. There may be more than two modes of such DMS filters and/or for other MMS filters.

MMS filters can have a relatively wide passband due to a combination of various resonant modes. MMS filters can have a balanced (differential) input and/or a balanced output with proper arrangement of IDTs. MMS filters can achieve a relatively low loss and a relatively good out of band rejection.

MMS filters can be temperature compensated by including a temperature compensation layer, such as a silicon dioxide ($SiO_2$) layer, over IDT electrodes. Such a temperature compensation layer can cause a temperature coefficient of frequency (TCF) of an MMS filter to be closer to zero. In some applications, an MMS filter can include a multi-layer piezoelectric substrate.

In certain applications, MMS filters can be receive filters arranged to filter radio frequency signals received by an antenna. MMS filters can be included in a receive filter that also includes a plurality of acoustic resonators arranged in a ladder topology.

With acoustic velocity adjustment layers disclosed herein, an MMS filter can implement different acoustic velocity regions while keeping pitches in IDT structures substantially uniform or with a relatively small amount of pitch modulation. The IDT structure can be positioned between the piezoelectric layer and an acoustic velocity adjustment structure. Accordingly, the acoustic velocity adjustment layer can be implemented above an IDT structure of a SAW device in a vertical stack.

FIG. 1A illustrates a top plan view of a multimode longitudinally coupled surface acoustic wave filter 1 according to one embodiment. FIG. 1B illustrates a velocity profile of the MMS filter 1 shown in FIG. 1A. FIG. 1C illustrates a pitch profile of the MMS filter 1 shown in FIG. 1A. Vertical dashed lines between FIGS. 1A, 1B and 1C indicate relative positions of the illustrated elements.

The MMS filter 1 illustrated in FIG. 1A includes a first interdigital transducer electrode 10, a second interdigital transducer electrode 12, a third interdigital transducer electrode 14, a first acoustic reflector 16, and a second acoustic reflector 18. The first IDT electrode 10, the second IDT electrode 12, and the third IDT electrode 14 are longitudinally coupled to each other. The first IDT electrode 10, the second IDT electrode 12, and the third IDT electrode 14 are positioned between the first acoustic reflector 16 and the second acoustic reflector 18.

The MMS filter 1 has a first-velocity region 20, a second-velocity region 22, and a third-velocity region 24. The SAW structure 1 also includes an acoustic velocity adjustment structure (e.g., a high speed layer 26 and a low speed layer 28). The acoustic velocity adjustment structure is formed over at least a portion of the IDT electrodes of the MMS filter 1.

The second-velocity region 22 has an acoustic wave propagation velocity V2. FIG. 1B shows that, in the illustrated MMS filter 1, the first-velocity region 20 has an acoustic wave propagation velocity V1 that is about 1.055*V, and the third-velocity region 24 has an acoustic wave propagation velocity V3 that is about 0.87*V. The first-velocity region 20 corresponds to a region where the high speed layer 26 is present and the third-velocity region 24 corresponds to a region where the low speed layer 28 is present. The velocity differences between the first-velocity region 20, second-velocity region 22, and the third-velocity region 24 can be created primarily by the high speed layer 26 and the low speed layer 28.

FIG. 1C shows that the first interdigital transducer electrode 10, the second interdigital transducer electrode 12, the third interdigital transducer electrode 14, the first acoustic reflector 16, and the second acoustic reflector 18 have substantially the same pitch. In other words, fingers of the first interdigital transducer electrode 10, the second interdigital transducer electrode 12, the third interdigital transducer electrode 14, the first acoustic reflector 16, and the second acoustic reflector 18 are approximately evenly spaced.

Figure 2B:
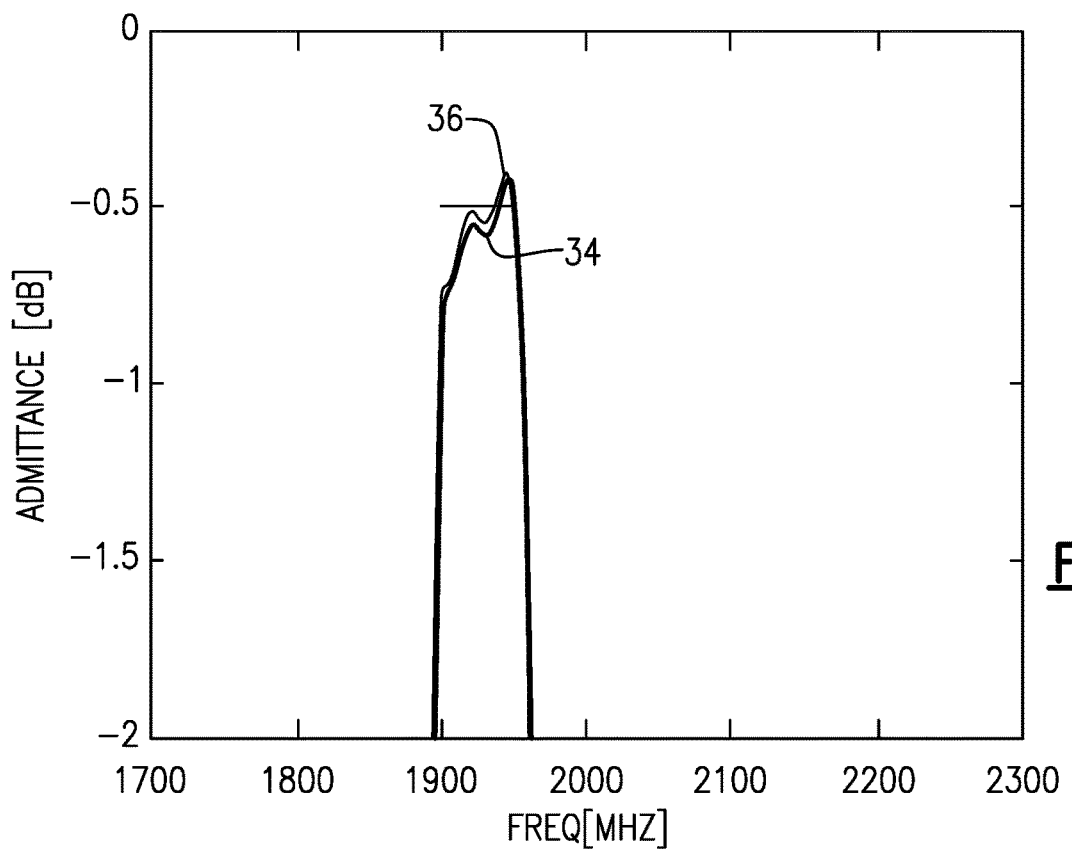
FIG. 2B is another graph that illustrates simulated admittance results of the two SAW filters.

FIGS. 2A and 2B are graphs that illustrate simulated admittance results of two SAW filters. FIG. 2A shows a curve 30 for a first SAW filter that includes the MMS filter 1 illustrated in FIG. 1A and a curve 32 for a second SAW filter that is pitch modulated. A pitch modulation can be achieved by varying spacings between fingers of IDT electrodes and/or acoustic reflectors of a SAW filter. In contrast to the second SAW filter, the first SAW filter is not pitch modulated. Unlike the first SAW filter, the second SAW filter does not have the high speed layer 26 or the low speed layer 28. FIG. 2B shows a curve 34 for the first SAW filter that includes the MMS filter 1 illustrated in FIG. 1A and a curve 36 for the second SAW filter that is pitch modulated.

From these curves 30, 32, 34, and 36, it can be observed that similar simulated admittance results can be obtained from a SAW filter with an acoustic velocity adjustment structure (e.g., a high speed layer 26, and a low speed layer 28) and a SAW filter that is pitch modulated. In some manufacturing processes, it may be easier to form the acoustic velocity adjustment structure than forming the IDT structures with varying pitch. Therefore, it can be beneficial to be able to adjust the acoustic wave propagation velocity without modulating the pitch. Moreover, since some loss mechanisms related to pitch modulation may be difficult to simulate and/or model, the MMS filter of 1A may be able to achieve additional loss improvements that are not reflected in the simulation results shown in FIGS. 2A and 2B.

FIG. 3A illustrates a cross section of an MMS filter 2 according to one embodiment. FIG. 3B illustrates a top plan view of the MMS filter 2 illustrated in FIG. 3A. Vertical dashed lines indicate relative positions of components between FIGS. 3A and 3B. The MMS filter 2 includes a piezoelectric layer 40, an interdigital transducer (IDT) structure 42 on the piezoelectric layer 40, and a temperature compensation layer 44 over the IDT structure 42. The MMS filter 2 also includes an acoustic velocity adjustment structure (e.g., a high speed layer 26 and a low speed layer 28). Further, the MMS filter 2 has a first-velocity region 20, a second-velocity region 22, and a third-velocity region 24. The piezoelectric layer 40 and the temperature compensation layer 44 are omitted from FIG. 3B.

The MMS filter 2 includes the piezoelectric layer 40 and a vertical stack 41 over the piezoelectric layer 40. The vertical stack 41 includes the IDT structure 42 and the velocity adjustment structure over the IDT structure 42. The vertical stack 41 is arranged such that acoustic wave propagation velocity in the first-velocity region 20 is faster than in the second-velocity region 22. The vertical stack 41 is also arranged such that acoustic wave propagation velocity in the second-velocity region 22 is faster than in the third-velocity region 24. Accordingly, in the MMS filter 2, the vertical arrangement in the vertical stack causes different regions to have different acoustic velocities. This is different than changing IDT electrode spacing to adjust acoustic velocity.

The piezoelectric layer 40 can include any suitable piezoelectric layer, such as a lithium niobate (LN) layer or a lithium tantalate (LT) layer. A thickness of the piezoelectric layer 40 can be selected based on a wavelength λ or L of a surface acoustic wave generated by the MMS filter 2.

The IDT structure 42 includes a first IDT electrode 10, a second IDT electrode 12, a third IDT electrode 14, a first acoustic reflector 16, and a second acoustic reflector 18. The IDT electrodes 10, 12, and 14 are longitudinally coupled to each other. The IDT electrodes 10, 12, and 14 have a pitches that can set the wavelength λ or L of a surface acoustic wave in the MMS filter 2.

The IDT structure 42 can include any suitable material. For example, IDT structure 42 can include tungsten (W), aluminum (Al), copper (Cu), magnesium (Mg), titanium (Ti), molybdenum (Mo), the like, or any suitable combination thereof. The IDT structure 42 may include alloys, such as AlMgCu, AlCu, etc. In some embodiments, one or more of the first IDT electrode 10, the second IDT electrode 12, the third IDT electrode 14, the first acoustic reflector 16, and/or the second acoustic reflector 18 can have a multilayer structure.

The illustrated IDT structure 42 has a substantially uniform pitch. In other words, the pitch or the spacings between the fingers of the first IDT electrode 10, the second IDT electrode 12, the third IDT electrode 14, the first acoustic reflector 16, and the second acoustic reflector 18 of the MMS filter 2 are the same or generally similar. In certain applications, a variation of the pitch in the IDT structure 42 can be within 10 percent (10%) of the pitch. According to some of these applications, the variation of the pitch in the IDT structure 42 can be within 5% of the pitch.

The acoustic velocity adjustment structure can adjust the acoustic wave propagation velocity of a surface acoustic wave generated by the MMS filter 2. The high speed layer 26 can increase the acoustic wave propagation velocity and the low speed layer 28 can decrease the acoustic wave propagation velocity. Accordingly, the high speed layer 26 can define the first-velocity region 20, and the low speed layer 28 can define the third-velocity region 24.

The high speed layer 26 can be disposed at any suitable location over the IDT structure 42. As illustrated in FIG. 3A, the high speed layer 26 can be disposed on the temperature compensation layer 44. In the illustrated MMS filter 2, the high speed layers 26 are positioned over at least a gap between the first IDT electrode 10 and the second IDT electrode 12, and a gap between the first IDT electrode 10 and the third IDT electrode 14. The high speed layer 26 can overlap with a portion of the first IDT electrode 10. For example, each of the high speed layers 26 can overlap with up to one third of the IDT electrode 10. Similarly, each of the high speed layers 26 can overlap with a portion of the second or third IDT electrode 10.

The high speed layer 26 can include any suitable material that can increase the acoustic wave propagation velocity. In some embodiments, the high speed layer 26 can include silicon nitride (SiN), aluminum oxide ($Al_2O_3$), aluminum nitride, like materials, or any suitable combination thereof. In some embodiments a thickness of the high speed layer 26 can affect the amount of velocity change by the high speed layer 26.

The low speed layer 28 can be disposed at any suitable location over the IDT structure 42. As illustrated in FIG. 3A, the low speed layer 28 can be embedded in the temperature compensation layer 44. In the illustrated MMS filter 2, the low speed layers 28 are positioned over at least the first acoustic reflector 16 and the second acoustic reflector 18. The low speed layers 28 can also be positioned over a gap between the second IDT electrode 12 and the first acoustic reflector 16, and a gap between the third IDT electrode 14 and the second acoustic reflector 18. The low speed layers 28 can overlap with a portion of the second IDT electrode 12 and a portion of the third IDT electrode 14.

The low speed layer 28 can include any suitable material that can decrease the acoustic wave propagation velocity. In some embodiments, the low speed layer 28 can include, metal, such as, molybdenum (Mo), copper (Cu), tungsten (W), titanium (Ti), gold (Au), silver (Ag), ruthenium (Ru), and/or platinum (Pt), and/or dielectric, such as, tantalum ($Ta_2O_3$), and/or tellurium dioxide ($TeO_2$). In some embodiments, a thickness of the low speed layer 26 can affect the amount of velocity change by the low speed layer 26.

The acoustic wave propagation velocity at the first-velocity region 20 of the and/or 2 has a velocity v1. The acoustic wave propagation velocity at the second-velocity region 22 of the SAW structure 2 has a velocity v2. The acoustic wave propagation velocity at the third-velocity region 24 of the SAW structure 2 has a velocity v3. The high speed layer 26 can increase the velocity v1 at the first-velocity region 20 relative to the velocity v2 at the second-velocity region 22. The low speed layer 28 can decrease the velocity v3 at the third-velocity region 24 relative to the velocity v2 at the second-velocity region 22. Therefore, the velocity v1 can be greater than the velocity v2 and the velocity v3, and the velocity v3 can be slower than the velocity v1 and the velocity v2.

Although the MMS filter 2 illustrated in FIGS. 3A and 3B shows a velocity relationship of v1>v2>v3 between the first-velocity region 20, the second-velocity region 22, and the third-velocity region 24, in some embodiments different velocity regions with different velocity relationships can alternatively or additionally be implemented.

Further, the same velocity relationships between the first-velocity region 20, the second-velocity region 22, and the third-velocity region 24 can be achieved by some other embodiments of the acoustic velocity adjustment structure disclosed herein, and any suitable combination thereof. Moreover, in certain embodiments, there may be more regions and/or sub-regions than what are illustrated in the FIGS. 3A and 3B and/or other illustrated embodiments. For example, there can be four or five regions that have different acoustic propagation wave velocities and/or a region can have sub-regions that have different acoustic propagation wave velocities. FIGS. 3C-14B illustrate embodiments of a multimode longitudinally coupled SAW filters. Any suitable principles and advantages of these embodiments can be implemented together with each other and/or with other embodiments.

FIG. 3C illustrates a cross section of an MMS filter 2' according to another embodiment. The MMS filter 2' is like the MMS filter 2 of FIG. 3A except that the MMS filter 2' additionally includes a support substrate 48 on a side of the piezoelectric layer 40 that is opposite to the IDT electrode structure 42. FIG. 3C illustrates that an acoustic velocity adjustment structure (e.g., the vertical stack 41) can be implemented in a MMS filter with a multi-layer piezoelectric substrate. In certain applications, the piezoelectric layer 40 can have a thickness of less than the pitch λ of the IDT electrodes in the MMS filter 2'.

The support substrate 48 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. As one example, the MMS filter 2' can include a lithium niobate/silicon piezoelectric substrate in certain applications.

The support substrate 48 can have a relatively high impedance. An acoustic impedance of the support substrate 48 can be higher than an acoustic impedance of the piezoelectric layer 40. For instance, the support substrate 48 can have a higher acoustic impedance than an acoustic impedance of lithium niobate and a higher acoustic impedance than lithium tantalate. The acoustic impedance of the support substrate 48 can be higher than an acoustic impedance of the temperature compensation layer 44. The MMS filter 2' including the piezoelectric layer 40 on a high impedance support substrate 48, such as silicon substrate, can achieve better thermal dissipation compared to a similar MMS filter without the high impedance support substrate 48.

In certain embodiments, an MMS filter can include two or more layers on the side of the piezoelectric layer 40 that is opposite to the IDT electrodes 10, 12, 14. In some embodiments, there can be an additional layer between the piezoelectric layer 40 and the support substrate 48. The additional layer can be a low impedance layer that has a lower acoustic impedance than the support substrate 48. In some embodiments, the additional layer can be a silicon dioxide ($SiO_2$) layer. The additional layer can increase adhesion between layers of the multi-layer piezoelectric substrate. In such applications, the additional layer can be referred to as an adhesion layer. Alternatively or additionally, the additional layer can increase heat dissipation in the MMS filter relative to the MMS filters 2, 2'. In such applications, the additional layer can be referred to as a heat dissipation layer. The additional layer can reduce back reflection of the support substrate in certain applications. In such applications, the additional layer can scatter back reflections by beam scattering. In some instances, the additional layer can be a polycrystalline spinel layer and the support substrate 48 can be a silicon layer.

FIG. 4A illustrates a cross section of an MMS filter 3 according to another embodiment. FIG. 4B illustrates a top plan view of the MMS filter 3 illustrated in FIG. 4A. Vertical dashed lines indicate relative positions of components between FIGS. 4A and 4B. The MMS filter 3 includes a piezoelectric layer 40, an interdigital transducer (IDT) structure 42 on the piezoelectric layer 40, and a temperature compensation layer 44 over the IDT structure 42. The MMS filter 3 also includes an acoustic velocity adjustment structure (e.g., a low speed layer 28). Further, the MMS filter 3 has a center region 50 and an outer region 24. The piezoelectric layer 40 and the temperature compensation layer 44 are omitted from FIG. 4B. The MMS filter 3 includes a vertical stack 41' that includes the IDT structure 42 and the low speed layer 28.

The MMS filter 3 is similar to the MMS filter 2 illustrated in FIGS. 3A and 3B. However, unlike the MMS filter 2 illustrated in FIGS. 3A and 3B, the acoustic velocity adjustment structure in the MMS filter 3 does not include the high speed layer 26. Accordingly, in the MMS filter 3, the acoustic propagation wave velocity in the center region 50 can be the substantially constant.

The acoustic wave propagation velocity at the center region 50 has a velocity v4. The acoustic wave propagation velocity at the outer region 24 of the MMS filter 3 has a velocity v3. The low speed layer 28 can decrease the acoustic propagation wave velocity v3 at the outer region 24 relative to the acoustic propagation wave velocity v4 at the center region 50.

FIG. 5A illustrates a cross section of an MMS filter 4 according to another embodiment. FIG. 5B illustrates a top plan view of the MMS filter 4 illustrated in FIG. 5A. FIGS. 5A and 5B illustrate that a higher acoustic velocity region can be created by the absence of a low velocity layer and/or a trench in a low velocity layer. Vertical dashed lines indicate relative positions of components between FIGS. 5A and 5B. The MMS filter 4 includes a piezoelectric layer 40, an interdigital transducer (IDT) structure 42 on the piezoelectric layer 40, and a temperature compensation layer 44 over the IDT structure 42. The MMS filter 4 also includes an acoustic velocity adjustment structure (e.g., a low speed layer 28 and a second low speed layer 52). Further, the MMS filter 4 has a first-velocity region 20, a second-velocity region 22, and a third-velocity region 24. The piezoelectric layer 40 and the temperature compensation layer 44 are omitted from FIG. 4B. The MMS filter 4 includes a vertical stack 41" that includes the IDT structure 42, the low speed layer 28, and the second low speed layer 52.

The MMS filter 4 is similar to the MMS filter 3 illustrated in FIGS. 4A and 4B. However, unlike the MMS filter 3 illustrated in FIGS. 4A and 4B, the acoustic velocity adjustment structure in the MMS filter 4 includes the second low speed layer 52. In some embodiments, the low speed layer 28 and the second low speed layer 52 can include different materials. In some embodiments, the low speed layer 28 and the second low speed layer 52 can have different thicknesses.

The acoustic wave propagation velocity at the first-velocity region 20 of the MMS filter 4 has a velocity v1. The acoustic wave propagation velocity at the second-velocity region 22 of the MMS filter 4 has a velocity v2. The acoustic wave propagation velocity at the third-velocity region 24 of the MMS filter 4 has a velocity v3. The low speed layer 28 can decrease the velocity v3 at the third-velocity region 24 relative to the velocity v1 at the first-velocity region 20. The second low speed layer 52 can decrease the velocity v2 at the second-velocity region 22 relative to the velocity v1 at the first-velocity region 20. The low speed layer 28 and the second low speed layer 52 can be selected such that the velocity v2 at the second-velocity region 22 is greater than the velocity v3 at the third-velocity region 24. Therefore, the velocity v1 can be greater than the velocity v2 and the velocity v3, and the velocity v3 can be slower than the velocity v1 and the velocity v2.

Although the first-velocity region 20 is free from a low velocity layer in the MMS filter 4, the velocity regions with the relative acoustic velocity relationships achieved by the MMS filter 4 can be achieved with a low speed layer over the first-velocity region 20 that is thinner that the illustrated low speed layers and of a suitable material. Moreover, in some applications, a third low speed layer over the first-velocity region 20 that decreases acoustic velocity less than the low speed layers 28 and 52 can achieve similar relative acoustic velocity relationships in regions of a SAW device.

FIG. 6A illustrates a cross section of an MMS filter 5 according to another embodiment. FIG. 6B illustrates a top plan view of the MMS filter 5 illustrated in FIG. 6A. Vertical dashed lines indicate relative positions of components between FIGS. 6A and 6B. The MMS filter 5 includes a piezoelectric layer 40, an interdigital transducer (IDT) structure 42 on the piezoelectric layer 40, and a temperature compensation layer 44 over the IDT structure. The MMS filter 5 also includes an acoustic velocity adjustment structure (e.g., a high speed layer 26). Further, the MMS filter 5 has a first-velocity region 20, a second-velocity region 22, and a third-velocity region 25. The piezoelectric layer 40 and the temperature compensation layer 44 are omitted from FIG. 6B. The MMS filter 5 includes a vertical stack 41''' that includes the IDT structure 42 and the high speed layer 26.

The MMS filter 5 is similar to the MMS filter 2 illustrated in FIGS. 3A and 3B. However, unlike the MMS filter 2 illustrated in FIGS. 3A and 3B, the acoustic velocity adjustment structure in the MMS filter 5 does not include the low speed layer 28. Accordingly, in the MMS filter 5, the acoustic propagation wave velocity of at the second-velocity region 22 and the third-velocity region 25 can be approximately the same.

The acoustic wave propagation velocity at the first-velocity region 20 of the MMS filter 5 has a velocity v1. The acoustic wave propagation velocity at the second-velocity region 22 of the MMS filter 5 has a velocity v2. The acoustic wave propagation velocity at the third-velocity region 25 of the MMS filter 5 has a velocity v2. The high speed layer 26 can increase the velocity v1 at the first-velocity region 20 relative to the velocity v2 at the second-velocity region 22 and/or the velocity v2 at the third-velocity region 25. Therefore, the velocity v1 can be greater than the velocity v2.

Figure 7B:
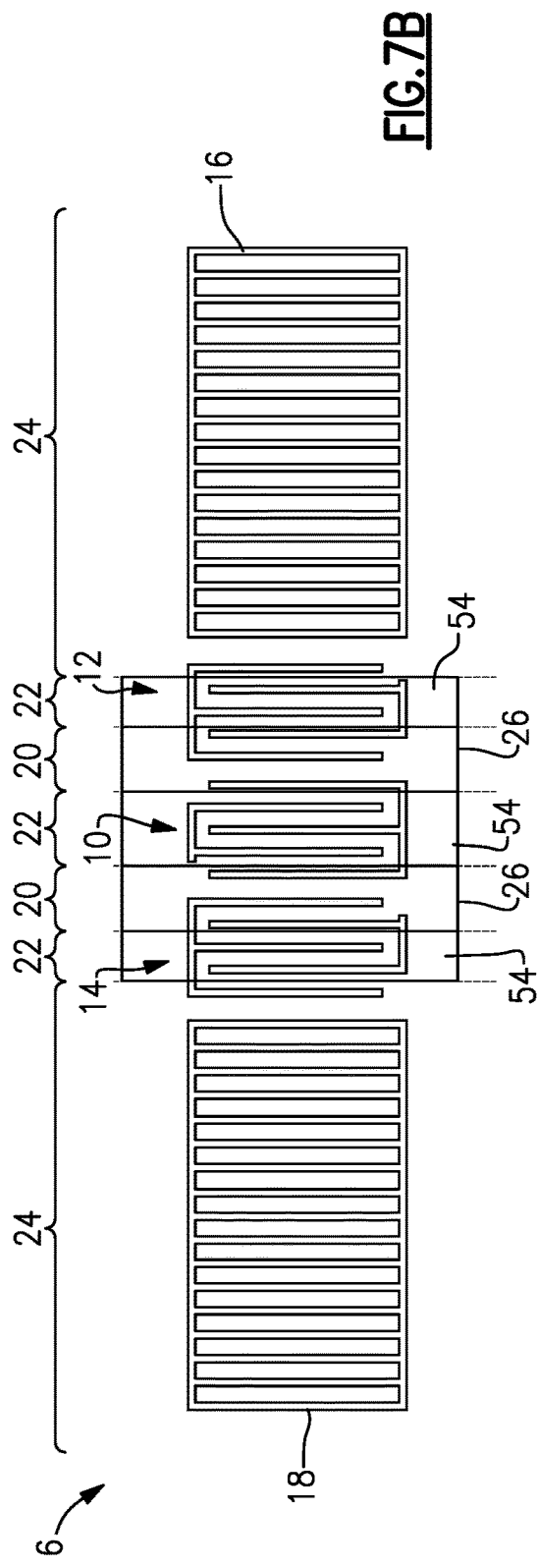
FIG. 7B illustrates a top plan view of the SAW structure illustrated in FIG. 7A.
Figure 7A:
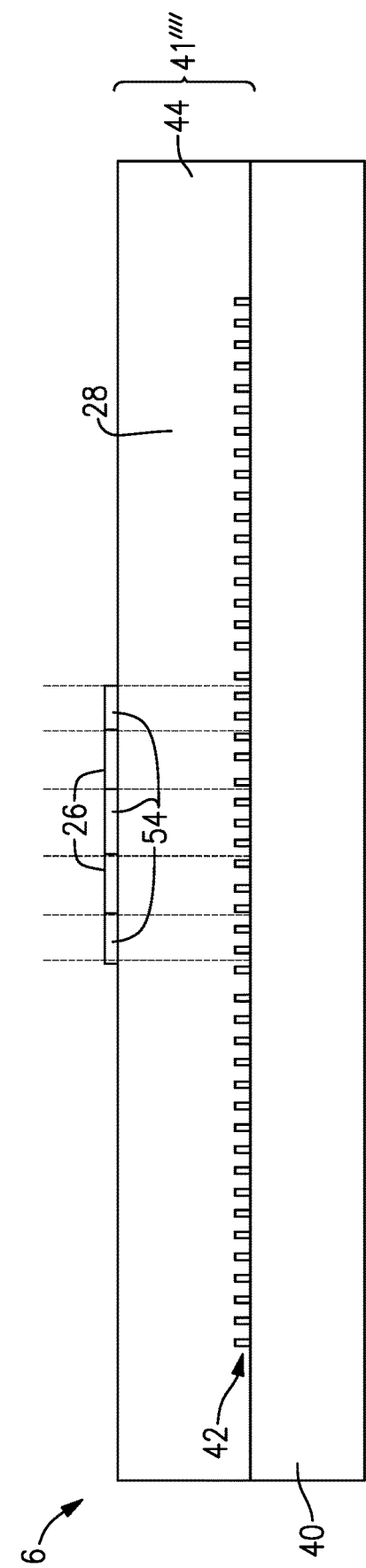
FIG. 7A illustrates a cross section of a multimode longitudinally coupled SAW structure according to one embodiment.

FIG. 7A illustrates a cross section of an MMS filter 6 according to another embodiment. FIG. 7B illustrates a top plan view of the MMS filter 6 illustrated in FIG. 7A. Vertical dashed lines indicate relative positions of components between FIGS. 7A and 7B. The MMS filter 6 includes a piezoelectric layer 40, an interdigital transducer (IDT) structure 42 on the piezoelectric layer 40, and a temperature compensation layer 44 over the IDT structure 42. The MMS filter 6 also includes an acoustic velocity adjustment structure (e.g., a high speed layer 26 and a second high speed layer 54). Further, the MMS filter 6 has a first-velocity region 20, a second-velocity region 22, and a third-velocity region 24. The piezoelectric layer 40 and the temperature compensation layer 44 are omitted from FIG. 7B. The MMS filter 6 includes a vertical stack 41'''' that includes the IDT structure 42, the high speed layer 26, and the second high speed layer 54.

The MMS filter 6 is similar to the MMS filter 5 illustrated in FIGS. 6A and 6B. However, unlike the MMS filter 5 illustrated in FIGS. 6A and 6B, the acoustic velocity adjustment structure in the MMS filter 6 includes the second high speed layer 54. In some embodiments, the high speed layer 26 and the second high speed layer 54 can include different materials. In some other embodiments, the high speed layer 26 and the second high speed layer 54 can have different thicknesses.

The acoustic wave propagation velocity at the first-velocity region 20 of the MMS filter 6 has a velocity v1. The acoustic wave propagation velocity at the second-velocity region 22 of the MMS filter 6 has a velocity v2. The acoustic wave propagation velocity at the third-velocity region 24 of MMS filter 6 has a velocity v3. The high speed layer 26 can increase the velocity v1 at the first-velocity region 20 relative to the velocity v3 at the third-velocity region 24. The second high speed layer 54 can increase the velocity v2 at the second-velocity region 22 relative to the velocity v3 at the third-velocity region 24. The high speed layer 26 and the second high speed layer 54 can be selected such that the velocity v1 at the first-velocity region 20 is greater than the velocity v2 at the second-velocity region 22. Therefore, the velocity v1 can be greater than the velocity v2 and the velocity v3, and the velocity v3 can be slower than the velocity v1 and the velocity v2 in the MMS filter 6.

FIG. 8A illustrates a cross section of an MMS filter 7 according to another embodiment. FIG. 8B illustrates a top plan view of the MMS filter 7 illustrated in FIG. 8A. Vertical dashed lines indicate relative positions of components between FIGS. 8A and 8B. The MMS filter 7 includes a piezoelectric layer 40, an interdigital transducer (IDT) structure 42 on the piezoelectric layer 40, a temperature compensation layer 44 over the IDT structure 42, and a passivation layer 56. The MMS filter 7 also includes an acoustic velocity adjustment structure (e.g., a high speed layer 26 and a low speed layer 28). Further, the MMS filter 7 has a first-velocity region 20, a second-velocity region 22, and a third-velocity region 24. The piezoelectric layer 40, the temperature compensation layer 44, and the passivation layer 56 are omitted from FIG. 8B. The MMS filter 7 includes a vertical stack 41''' that includes the IDT structure 42, the high speed layer 26, and a low speed layer 28.

The MMS filter 7 is similar to the MMS filter 2 illustrated in FIGS. 3A and 3B. However, unlike the MMS filter 2 illustrated in FIGS. 3A and 3B, the MMS filter 7 includes the passivation layer 56. In FIG. 8A, the passivation layer 56 is disposed on the temperature compensation layer 44, and the high speed layer 26 is positioned on the passivation layer 56. However, in some other embodiments, the high speed layer 26 can be positioned between the temperature compensation layer 44 and the passivation layer 56.

The illustrated passivation layer 56 is disposed entirely over an upper surface of the temperature compensation layer 44 in the illustrated cross section. However, the passivation layer 56 can be disposed partially over the upper surface of the temperature compensation layer 44 with one or more trenches, in some other instances. In some embodiments, the passivation layer 56 can be a dispersion adjustment layer. The dispersion adjustment layer can cause a magnitude of the velocity in the underlying region of the MMS filter 7 to be increased. In certain applications, the passivation layer 56 can include any suitable material to increase the magnitude of the velocity of the underlying region of the MMS filter 7. According in some applications, the passivation layer 56 can include silicon nitride (SiN). In some embodiments, the passivation layer 56 can be patterned such that the acoustic propagation velocity can be adjusted at certain regions of the MMS filter 7. For example, the passivation layer 56 can have a trench.

In some instances, the passivation layer 56 can physically protect the MMS filter 7. In some instances, the passivation layer 56 can be used for frequency trimming and/or frequency tuning. The passivation layer 56 can include a silicon nitride (SiN) layer and/or an aluminum oxide ($Al_2O_3$) layer.

FIG. 9A illustrates a cross section of an MMS filter 8 according to another embodiment. FIG. 9B illustrates a top plan view of the MMS filter 8 illustrated in FIG. 9A. Vertical dashed lines indicate relative positions of components between FIGS. 9A and 9B. The MMS filter 8 includes a piezoelectric layer 40, an interdigital transducer (IDT) structure 42 on the piezoelectric layer 40, a temperature compensation layer 44 over the IDT structure 42, and a passivation layer 56. The MMS filter 8 also includes an acoustic velocity adjustment structure (e.g., a high speed layer 26 and a low speed layer 28). Further, MMS filter 8 has a first-velocity region 20, a second-velocity region 22, and a third-velocity region 24. The piezoelectric layer 40, the temperature compensation layer 44, and the passivation layer 56 are omitted from FIG. 8B. The MMS filter 8 includes a vertical stack 41'''' that includes the IDT structure 42, the high speed layer 26, and the low speed layer 28.

The MMS filter 8 is similar to the MMS filter 7 illustrated in FIGS. 8A and 8B. However, unlike the MMS filter 7 illustrated in FIGS. 8A and 8B, the low speed layer 28 is disposed over the passivation layer 56.

FIG. 10A illustrates a cross section of an MMS filter 9 according to another embodiment. FIG. 10B illustrates a top plan view of the MMS filter 9 illustrated in FIG. 10A. Vertical dashed lines indicate relative positions of components between FIGS. 10A and 10B. The MMS filter 9 includes a piezoelectric layer 40, an interdigital transducer (IDT) structure 42 on the piezoelectric layer 40, and a temperature compensation layer 44 over the IDT structure 42. The MMS filter 9 also includes an acoustic velocity adjustment structure (e.g., a high speed layer 26 and a low speed layer 28). Further, the MMS filter 9 has a first-velocity region 20, a second-velocity region 22, a third-velocity region 24, and a fourth-velocity region 58. The piezoelectric layer 40, the temperature compensation layer 44, and the passivation layer 56 are omitted from FIG. 10B. The MMS filter 9 includes a vertical stack 41'''' that includes the IDT structure 42, the high speed layer 26, and the low speed layer 28.

The high speed layers 26 are positioned over at least gaps between the first IDT electrode 10 and the second IDT electrode 12, and the first IDT electrode 10 and the third IDT electrode 14. The high speed layers 26 are positioned also over at least a portion of the first IDT electrode 10, a portion of the second IDT electrode 12, and a portion of the third IDT electrode 14. The fourth-velocity region 58 can be defined at least in part by a portion where the high speed layer 26 and the low speed layer 28 overlap.

The acoustic wave propagation velocity at the first-velocity region 20 of the MMS filter 9 has a velocity v1. The acoustic wave propagation velocity at the second-velocity region 22 of the MMS filter 9 has a velocity v2. The acoustic wave propagation velocity at the third-velocity region 24 of the MMS filter 9 has a velocity v3. The acoustic wave propagation velocity at the fourth-velocity region 58 of the MMS filter 9 has a velocity v5. The high speed layer 26 can increase the velocity v1 at the first-velocity region 20 and the velocity v5 at the fourth-velocity region 58 relative to the velocity v2 at the second-velocity region 22. The low speed layer 28 can decrease the velocity v3 at the third-velocity region 24 relative to the velocity v2 at the second-velocity region 22.

In some embodiments, the high speed layer 26 and the low speed layer 28 can cancel out at least some of their effects at the portion where the high speed layer 26 and the low speed layer 28 overlap. In some embodiments, the high speed layer 26 and the low speed layer 28 can cancel out their effects at the portion where the high speed layer 26 and the low speed layer 28 overlap, such that the velocity v2 at the second-velocity region 22 and the velocity v5 at the fourth-velocity region 58 can be the same or generally similar. The high speed layer 26 and the second high speed layer 54 can be selected such that the velocity v1 at the first-velocity region 20 is greater than the velocity v2 at the second-velocity region 22 and the velocity v5 of the fourth-velocity region 58, and the velocity v3 at the third-velocity region is slower than the velocity v2 at the second-velocity region 22 and the velocity v5 of the fourth-velocity region 58.

FIG. 11A illustrates a cross section of an MMS filter 11 according to another embodiment. FIG. 11B illustrates a top plan view of the MMS filter 11 illustrated in FIG. 11A. Vertical dashed lines indicate relative positions of components between FIGS. 11A and 11B. The MMS filter 11 includes a piezoelectric layer 40, an interdigital transducer (IDT) structure 42 on the piezoelectric layer 40, and a passivation layer 56 over the IDT structure 42. The MMS filter 11 also includes an acoustic velocity adjustment structure (e.g., a high speed layer 26 and a low speed layer 28). Further, the MMS filter 11 has a first-velocity region 20, a second-velocity region 22, a third-velocity region 24, and a fourth-velocity region 58. The piezoelectric layer 40, the temperature compensation layer 44, and the passivation layer 56 are omitted from FIG. 11B. The high speed layer 28 and the low speed layer 26 are positioned over the passivation layer 56 in the MMS filter 11. The MMS filter 5 includes a vertical stack 41'''' that includes the IDT structure 42 and the high speed layer 26.

An acoustic velocity adjustment structure positioned over an IDT structure can adjust acoustic velocity in different acoustic velocity regions of a SAW device. Alternatively or additionally, IDT electrode thickness and/or material can be used to create different acoustic velocity regions in a SAW device. The IDT structure is another structure in the vertical stack 41'''''' over the piezoelectric layer 40 that can contribute to different acoustic velocities in different regions of a SAW device.

FIG. 12A illustrates a cross section of an MMS filter 13 according to another embodiment. FIG. 12B illustrates a top plan view of the MMS filter 13 illustrated in FIG. 12A. Vertical dashed lines indicate relative positions of components between FIGS. 12A and 12B. The MMS filter 13 includes a piezoelectric layer 40, an interdigital transducer (IDT) structure 42' on the piezoelectric layer 40, and a temperature compensation layer 44 over the IDT structure 42'. The MMS filter 13 also includes an acoustic velocity adjustment structure (e.g., a high speed layer 26 and a low speed layer 28). Further, the MMS filter 13 has a first-velocity region 20, a second-velocity region 22, and a third-velocity region 24. The piezoelectric layer 40 and the temperature compensation layer 44 are omitted from FIG. 12B. The MMS filter 13 includes a vertical stack 41'''''' that includes the IDT structure 42, the high speed layer 26, and the low speed layer 28.

The MMS filter 13 is similar to the MMS filter 2 illustrated in FIGS. 3A and 3B. However, unlike the MMS filter 2 illustrated in FIGS. 3A and 3B, the IDT structure 42' of the MMS filter 13 has different thicknesses or heights. The first, second, and third IDT electrodes 10, 12, 14 of the MMS filter 13 have thicknesses that are thinner than thicknesses of the first acoustic reflector 16' and the second acoustic reflector 18'. The thicker first and the second acoustic reflectors 16' and 18' can aid decreasing the velocity v3 at the third-velocity region 24. The similar effect may be obtained by using a different material for the first and the second acoustic reflectors 16' and 18' from the material of the IDT electrodes 10, 12, and 14. For example, the first and the second acoustic reflectors 16' and 18' may have a heavier and/or more dense material than the material of the IDT electrodes 10, 12, 14, in which the heavier and/or more dense material causes a reduction in acoustic velocity.

Figure 13B:
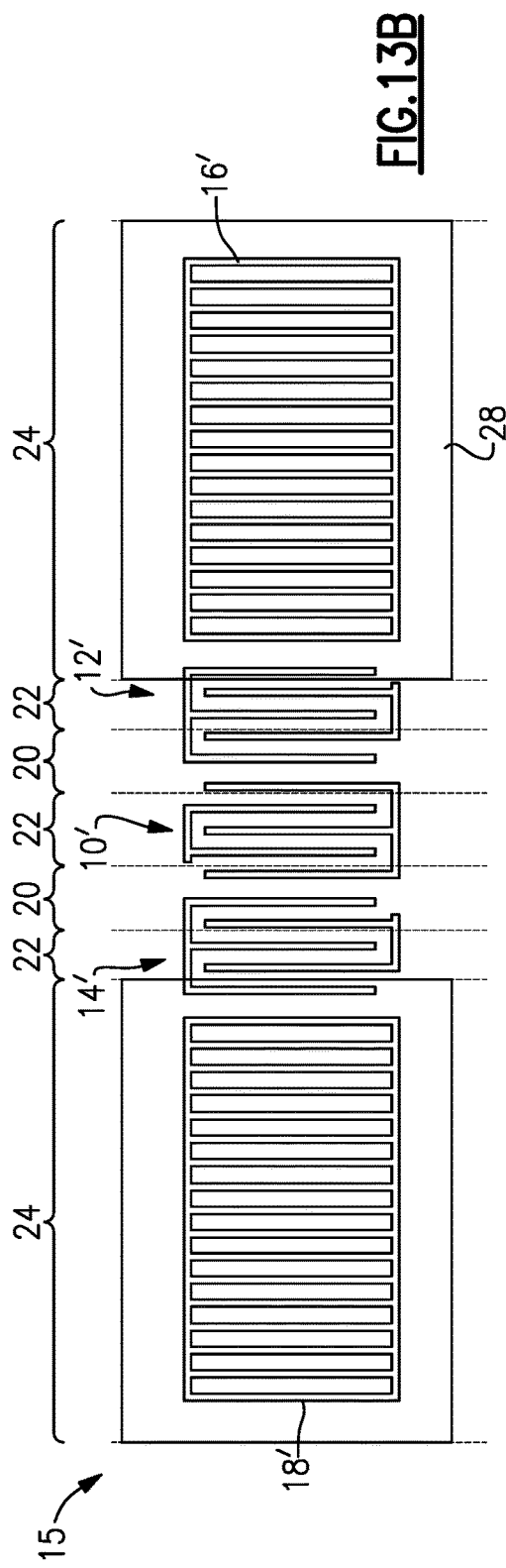
FIG. 13B illustrates a top plan view of the SAW structure illustrated in FIG. 13A.
Figure 13A:
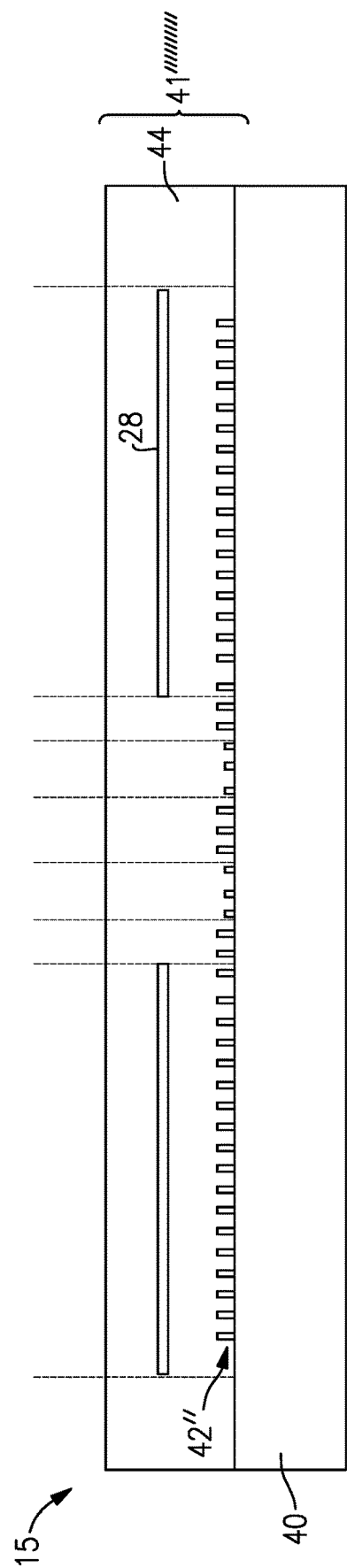
FIG. 13A illustrates a cross section of a multimode longitudinally coupled SAW structure according to one embodiment.

FIG. 13A illustrates a cross section of an MMS filter 15 according to another embodiment. FIG. 13B illustrates a top plan view of the MMS filter 15 illustrated in FIG. 13A. Vertical dashed lines indicate relative positions of components between FIGS. 13A and 13B. The MMS filter 15 includes a piezoelectric layer 40, an interdigital transducer (IDT) structure 42" on the piezoelectric layer 40, and a temperature compensation layer 44 over the IDT structure 42". The MMS filter 15 also includes an acoustic velocity adjustment structure (e.g., a low speed layer 28). Further, the MMS filter 15 has a first-velocity region 20, a second-velocity region 22, and a third-velocity region 24. The piezoelectric layer 40 and the temperature compensation layer 44 are omitted from FIG. 13B. The MMS filter 15 includes a vertical stack 41''''''' that includes the IDT structure 42 and the low speed layer 28.

The MMS filter 15 is similar to the MMS filter 13 illustrated in FIGS. 12A and 12B. However, unlike the MMS filter 13 illustrated in FIGS. 12A and 12B, the first, second, and third IDT electrodes 10', 12', 14' have different thicknesses or heights, and the high speed layer 26 is omitted in the MMS filter 15. The first, second, and third IDT electrodes 10', 12', 14' of the MMS filter 15 have thicker portions at the second-velocity region(s) 22.

The acoustic wave propagation velocity at the first-velocity region 20 of the MMS filter 15 has a velocity v1. The acoustic wave propagation velocity at the second-velocity region 22 of the MMS filter 15 has a velocity v2. The acoustic wave propagation velocity at the third-velocity region 24 of the MMS filter 15 has a velocity v3. The velocity v2 at the second-velocity region is decreased relative to the velocity v1 at the first-velocity region 20 by the thicker portions of the first, second, and third IDT electrodes 10', 12', 14' of the MMS filter 15. The velocity v3 at the third-velocity region 24 is decreased relative to the velocity v1 of the first-velocity region 20 by the thicker acoustic reflectors 16', 18' and the low speed layer 28. Therefore, the velocity v1 can be greater than the velocity v2 and the velocity v3, and the velocity v3 can be slower than the velocity v1 and the velocity v2 in the MMS filter 15.

Although some MMS filters disclosed herein include three longitudinally coupled IDT electrodes, an MMS filter in accordance with any suitable principles and advantages disclosed herein can include any other suitable number of longitudinally coupled IDT electrodes. FIG. 14A illustrates a cross section of an MMS filter 17 according to another embodiment. FIG. 14B illustrates a top plan view of the MMS filter 17 illustrated in FIG. 14A. Vertical dashed lines indicate relative positions of components between FIGS. 14A and 14B. The MMS filter 17 includes a piezoelectric layer 40, an interdigital transducer (IDT) structure 64 on the piezoelectric layer 40, a temperature compensation layer 44 over the IDT structure 64, and a passivation layer 56. The MMS filter 17 also includes an acoustic velocity adjustment structure (e.g., a high speed layer 26 and a low speed layer 28). Further, the MMS filter 17 has a first-velocity region 20, a second-velocity region 22, and a third-velocity region 24. The piezoelectric layer 40 and the temperature compensation layer 44 are omitted from FIG. 14B. The MMS filter 17 includes a vertical stack 41''''''' that includes the IDT structure 42, the high speed layer 26, and a low speed layer 28.

The MMS filter 17 is similar to the MMS filter 2 illustrated in FIGS. 3A and 3B. However, unlike the MMS filter 2 illustrated in FIGS. 3A and 3B, the IDT structure 64 of the MMS filter 17 includes a fourth IDT electrode 60 and a fifth IDT electrode 62. The illustrated IDT structure 64 includes five longitudinally coupled IDT electrodes 10,12 14, 60, and 62 positioned between acoustic reflectors 16 and 18. In the MMS filter 17, the first-velocity region 20 can also include gaps between the second IDT electrode 12 and the fourth IDT electrode 60, and between the third IDT electrode 14 and the fifth IDT electrode 62.

The acoustic wave propagation velocity at the first-velocity region 20 of the MMS filter 17 has a velocity v1. The acoustic wave propagation velocity at the second-velocity region 22 of the MMS filter 17 has a velocity v2. The acoustic wave propagation velocity at the third-velocity region 24 of the MMS filter 17 has a velocity v3. The high speed layer 26 can increase the velocity v1 at the first-velocity region 20 relative to the velocity v2 at the second-velocity region 22. The low speed layer 28 can decrease the velocity v3 at the third-velocity region 24 relative to the velocity v2 at the second-velocity region 22. Therefore, the velocity v1 can be greater than the velocity v2 and the velocity v3, and the velocity v3 can be slower than the velocity v1 and the velocity v2 in the MMS filter 17.

Although some embodiments disclosed herein related to MMS filters, any suitable principles and advantages disclosed herein can be implemented in a SAW resonator. FIG. 15A illustrates a cross section of a SAW resonator 19 according to one embodiment. FIG. 15B illustrates a top plan view of the SAW resonator 19 illustrated in FIG. 15A. Vertical dashed lines indicate relative positions of components between FIGS. 15A and 15B. The SAW resonator 19 includes a piezoelectric layer 40, an interdigital transducer (IDT) structure 66 on the piezoelectric layer 40, a temperature compensation layer 44 over the IDT structure 66, and a passivation layer 56. The IDT structure 66 includes an IDT electrode 68, a first acoustic reflector 16, and a second acoustic reflector 18. The IDT electrode 68 has a first side closer to the first acoustic reflector 16, and a second side closer to the second acoustic reflector 18. The MMS filter 17 also includes an acoustic velocity adjustment structure (e.g., a high speed layer 26 and a low speed layer 28). Further, the SAW resonator 19 has a first-velocity region 20, a second-velocity region 22, and a third-velocity region 24. The piezoelectric layer 40, the temperature compensation layer 44, and the passivation layer 56 are omitted from FIG. 15B. The SAW resonator 19 includes a vertical stack 41'''''''' that includes the IDT structure 42, the high speed layer 26, and a low speed layer 28.

The high speed layers 26 are positioned over at least a portion between the first side of the IDT electrode 68 and the first acoustic reflector 16, and between the second side of the IDT electrode 68 and the second acoustic reflector 18. The high speed layer 26 can overlap with at least a portion of the IDT electrode 68. For example, the high speed layer 26 can overlap with less than one third of the IDT electrode 68.

The acoustic wave propagation velocity at the first-velocity region 20 of the SAW resonator 19 has a velocity v1. The acoustic wave propagation velocity at the second-velocity region 22 of the SAW resonator 19 has a velocity v2. The acoustic wave propagation velocity at the third-velocity region 24 of the SAW resonator 19 has a velocity v3. The high speed layer 26 can increase the velocity v1 at the first-velocity region 20 relative to the velocity v2 at the second-velocity region 22. The low speed layer 28 can decrease the velocity v3 at the third-velocity region 24 relative to the velocity v2 at the second-velocity region 22. Therefore, the velocity v1 can be greater than the velocity v2 and the velocity v3, and the velocity v3 can be slower than the velocity v1 and the velocity v2 in the SAW resonator 19.

An MMS filter and/or a SAW resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS SAW resonators disclosed herein. FR1 can be from 410 MHz to 7.125 GHz, for example, as specified in a current 5G NR specification. MMS filters disclosed herein can be implemented with less pitch variation than some previous MMS filters. MMS filters disclosed herein can filter higher frequency signals with the same IDT electrode line and space process limitations compared to some previous MMS filters. Filtering higher frequency signals can be advantageous in 5G applications. One or more MMS filters and/or SAW resonators in accordance with any suitable principles and advantages disclosed herein can be included in a filter arranged to filter a radio frequency signal in a fourth generation (4G) Long Term Evolution (LTE) operating band and/or in a filter having a passband that includes a 4G LTE operating band and a 5G NR operating band.

Figure 16:
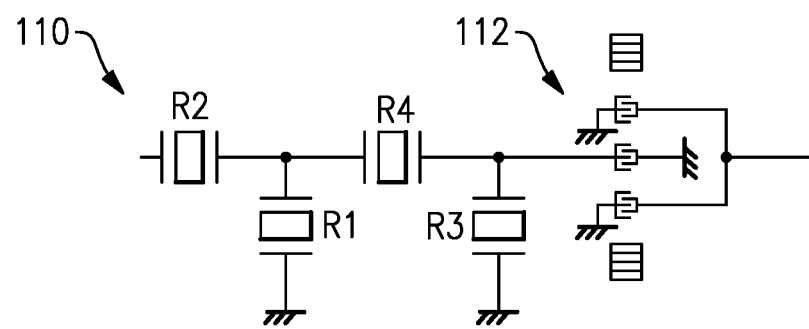
FIG. 16 is a schematic diagram of an acoustic filter that includes ladder stages and a multi-mode surface acoustic wave filter.

FIG. 16 is a schematic diagram of an acoustic filter 110 that includes ladder stages and a multi-mode surface acoustic wave filter 112. The illustrated acoustic filter 110 includes series resonators R2 and R4, shunt resonators R1 and R3, and multi-mode surface acoustic wave filter 112. The filter 110 can be a receive filter. The multi-mode surface acoustic wave filter 112 can be connected to a receive port. The multi-mode surface acoustic wave filter 112 includes longitudinally coupled IDT electrodes. The multi-mode surface acoustic wave filter 112 can include a temperature compensation layer over longitudinally coupled IDT electrodes in certain applications. Alternatively or additionally, the multi-mode surface acoustic wave filter 112 can include a multi-layer piezoelectric substrate in certain applications.

Although FIG. 16 illustrates an example filter topology, any suitable filter topology can include a SAW device in accordance with any suitable principles and advantages disclosed herein. Example filter topologies, include a ladder topology, a lattice topology, a hybrid ladder and lattice topology, a multi-mode SAW filter, a multi-mode SAW filter combined with one or more other SAW resonators, and the like.

Figure 17:
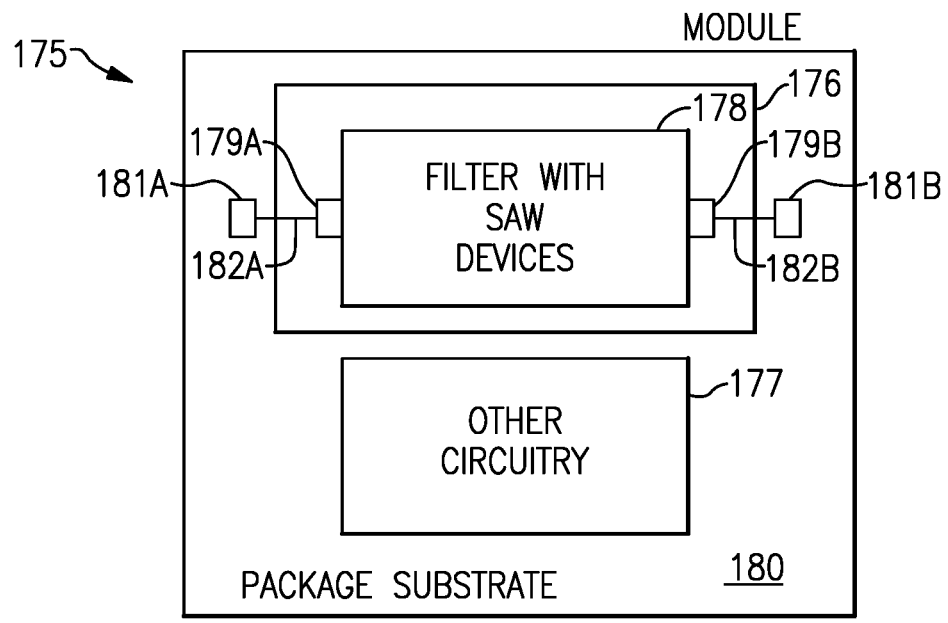
FIG. 17 is a schematic diagram of a radio frequency module that includes a surface acoustic wave resonator according to an embodiment.

FIG. 17 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW devices with any suitable combination of features of the SAW devices disclosed herein. The SAW component 176 can include a SAW die that includes one or more MMS filters and/or one or more SAW resonators.

The SAW component 176 shown in FIG. 17 includes a filter 178 and terminals 179A and 179B. The filter 178 includes SAW devices. One or more of the SAW devices can be implemented in accordance with any suitable principles and advantages of the MMS filter 1 of FIG. 1A and/or any MMS filter disclosed herein. The terminals 179A and 178B can serve, for example, as an input contact and an output contact. The SAW component 176 and the other circuitry 177 are on a common packaging substrate 180 in FIG. 17. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 18:
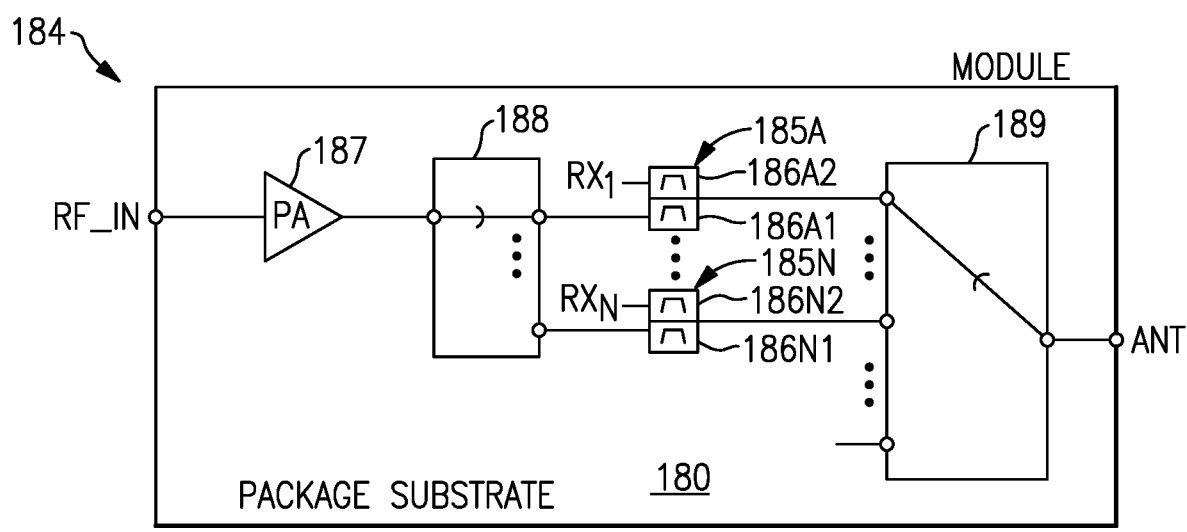
FIG. 18 is a schematic diagram of a radio frequency module that includes filters with surface acoustic wave resonators according to an embodiment.

FIG. 18 is a schematic diagram of a radio frequency module 184 that includes a surface acoustic wave device according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW devices in accordance with any suitable principles and advantages disclosed herein. Similarly, one or more of the receive filters 186A2 to 186N2 can include one or more SAW devices in accordance with any suitable principles and advantages disclosed herein. Although FIG. 18 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 19:
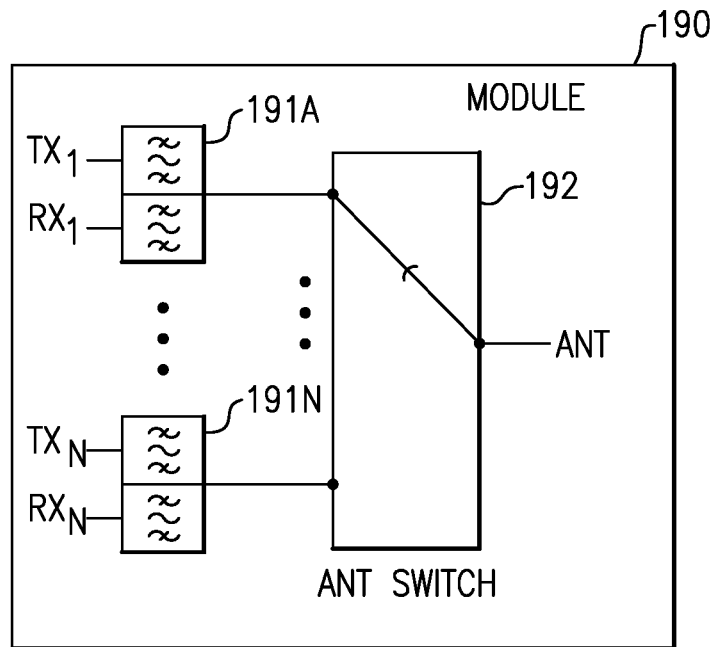
FIG. 19 is a schematic block diagram of a module that includes an antenna switch and duplexers that include a surface acoustic wave resonator according to an embodiment.

FIG. 19 is a schematic block diagram of a module 190 that includes duplexers 191A to 191N and an antenna switch 192. One or more filters of the duplexers 191A to 191N can include any suitable number of surface acoustic wave devices in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190. MMS filters disclosed herein can be implemented in receive filters of one or more of the duplexers 191A to 191N, for example.

Figure 20A:
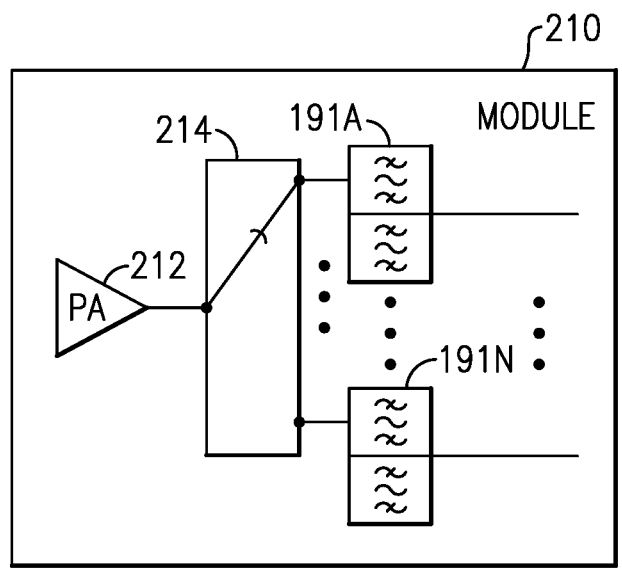
FIG. 20A is a schematic block diagram of a module that includes a power amplifier, a radio frequency switch, and duplexers that include a surface acoustic wave resonator according to an embodiment.

FIG. 20A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave devices in accordance with any suitable principles and advantages discussed herein. Any suitable number of duplexers 191A to 191N can be implemented.

Figure 20B:
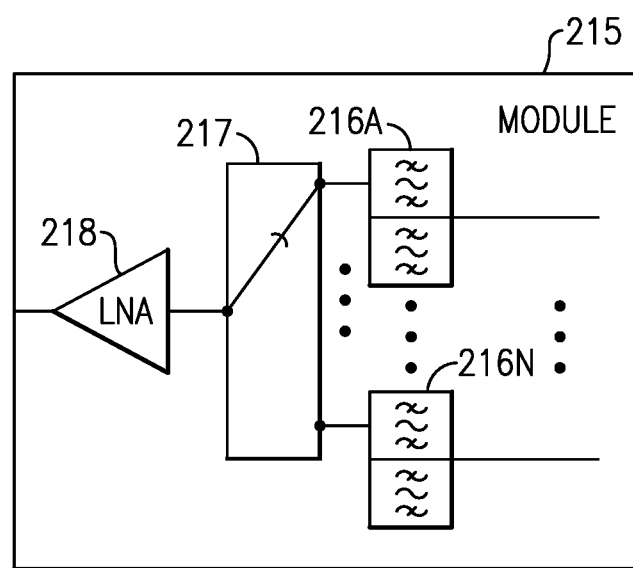
FIG. 20B is a schematic block diagram of a module that includes filters, a radio frequency switch, and a low noise amplifier according to an embodiment.

FIG. 20B is a schematic block diagram of a module 215 that includes filters 216A to 216N, a radio frequency switch 217, and a low noise amplifier 218 according to an embodiment. One or more filters of the filters 216A to 216N can include any suitable number of MMS filters and/or acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 21A:
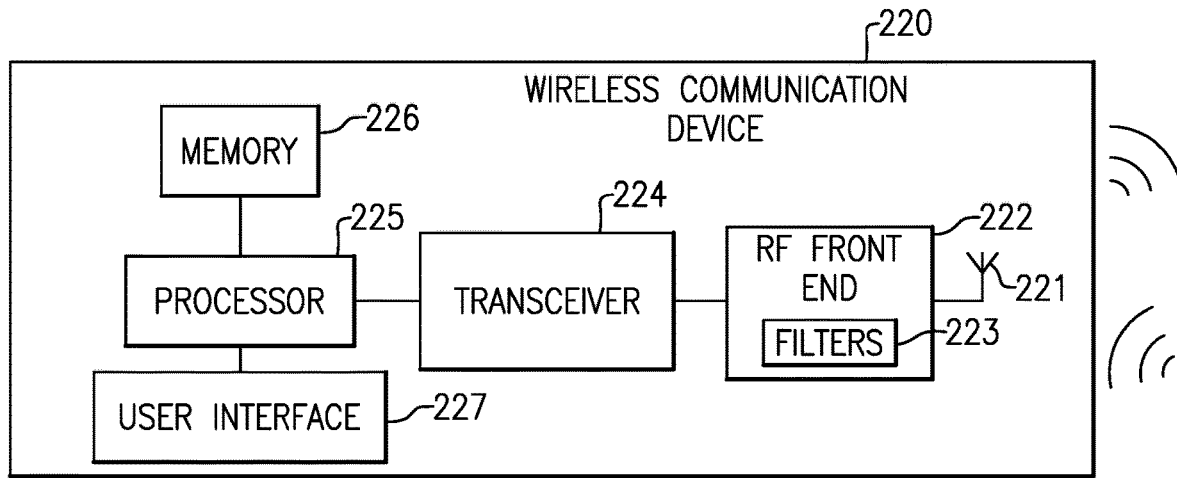
FIG. 21A is a schematic block diagram of a wireless communication device that includes a filter with a surface acoustic wave resonator in accordance with one or more embodiments.

FIG. 21A is a schematic diagram of a wireless communication device 220 that includes filters 223 in a radio frequency front end 222 according to an embodiment. The filters 223 can include one or more SAW devices in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW devices of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 21B:
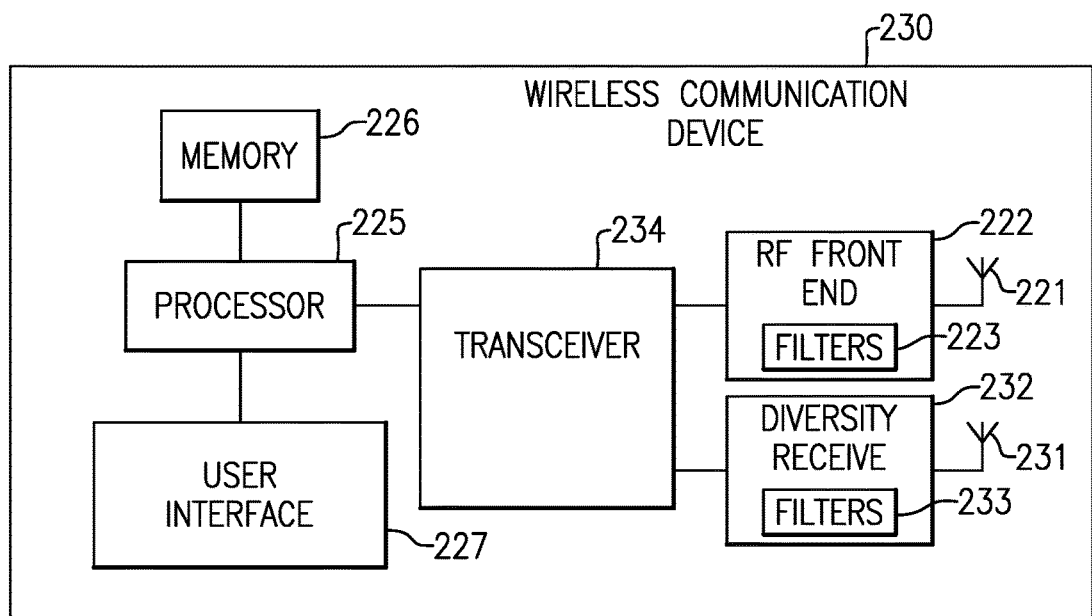
FIG. 21B is a schematic block diagram of another wireless communication device that includes a filter with a surface acoustic wave resonator in accordance with one or more embodiments.

FIG. 21B is a schematic diagram of a wireless communication device 230 that includes filters 223 in a radio frequency front end 222 and a second filter 233 in a diversity receive module 232. The wireless communication device 230 is like the wireless communication device 200 of FIG. 21A, except that the wireless communication device 230 also includes diversity receive features. As illustrated in FIG. 21B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW devices that include any suitable combination of features discussed with reference to any embodiments discussed above. The diversity module 232 and the radio frequency front end 222 can together be considered part of a radio frequency front end.

Although embodiments disclosed herein relate to surface acoustic wave filters and/or resonators, any suitable principles and advantages disclosed herein can be applied to other types of acoustic wave devices that include an IDT electrode, such as Lamb wave devices and/or boundary wave devices. For example, any suitable combination of features of the acoustic velocity adjustment structures disclosed herein can be applied to a Lamb wave device and/or a boundary wave device.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave device comprising:
    a piezoelectric layer; and
    a vertical stack over the piezoelectric layer, the vertical stack including a first acoustic reflector on the piezoelectric layer, a second acoustic reflector on the piezoelectric layer, and an interdigital transducer electrode on the piezoelectric layer and positioned between the first acoustic reflector and the second acoustic reflector, the interdigital transducer electrode having a first side closer to the first acoustic reflector and a second side closer to the second acoustic reflector, and a vertical arrangement of the vertical stack configured such that an acoustic wave propagation velocity of a first region between the first side and a first reflector is faster than an acoustic wave propagation velocity of a second region between the first side and the second side.

2. The surface acoustic wave device of claim 1 wherein the vertical stack includes a high speed layer over the first region, wherein the vertical stack includes a temperature compensation layer between a portion of the piezoelectric layer and the high speed layer.

3. The surface acoustic wave device of claim 2 wherein the high speed layer includes a silicon nitride layer, or an aluminum oxide layer.

4. The surface acoustic wave device of claim 1 further comprising a second interdigital transducer electrode positioned between the first side and the first reflector, the second interdigital transducer electrode being longitudinally coupled to the first interdigital transducer electrode.

5. The surface acoustic wave device of claim 4 further comprising a third interdigital transducer electrode positioned between the second side and the second reflector, the third interdigital transducer electrode being longitudinally coupled to the second interdigital transducer electrode.

6. The surface acoustic wave device of claim 4 wherein the second region is in between the first side and the second interdigital transducer electrode.

7. The surface acoustic wave device of claim 1 wherein the second region overlaps at least a portion of the interdigital transducer electrode.

8. The surface acoustic wave device of claim 1 wherein an acoustic wave propagation velocity of a third region over the first acoustic reflector is slower than the first region.

9. The surface acoustic wave device of claim 8 wherein the vertical stack includes a low speed layer positioned over the first acoustic reflector in the third region, the low speed layer configured to decrease the acoustic wave propagation velocity in the third region.

10. The surface acoustic wave device of claim 9 wherein the metal layer includes at least one of a molybdenum layer, a copper layer, a tungsten layer, a titanium layer, a silver layer, a gold layer, a ruthenium layer, or a platinum layer.

11. The surface acoustic wave device of claim 9 wherein the low speed layer is a dielectric layer, the dielectric layer includes at least one of tantalum oxide layer or a tellurium dioxide layer.

12. The surface acoustic wave device of claim 1 wherein the vertical stack includes a high speed layer positioned over at least a portion of the interdigital transducer electrode in a third region between the second side and the second acoustic reflector, the high speed layer configured to increase the acoustic wave propagation velocity in the second region.

13. The surface acoustic wave device of claim 12 wherein the high speed layer includes at least one of a silicon nitride layer, silicon oxynitride layer, or aluminum oxide layer.

14. The surface acoustic wave device of claim 12 wherein the vertical stack includes a temperature compensation layer between a portion of the interdigital transducer electrode structure and the high speed layer.

15. The surface acoustic wave device of claim 1 wherein the first acoustic reflector, the second acoustic reflector, and the interdigital transducer electrode each has substantially uniform pitch, the first acoustic reflector, the second acoustic reflector, and the interdigital transducer electrode have a pitch variation of no greater than 5 percent.

16. A radio frequency module comprising:
 a filter including a surface acoustic wave device having a piezoelectric layer and a vertical stack over the piezoelectric layer, the vertical stack including a first acoustic reflector on the piezoelectric layer, a second acoustic reflector on the piezoelectric layer, and an interdigital transducer electrode on the piezoelectric layer and positioned between the first acoustic reflector and the second acoustic reflector, the interdigital transducer electrode having a first side closer to the first acoustic reflector and a second side closer to the second acoustic reflector, and a vertical arrangement of the vertical stack configured such that an acoustic wave propagation velocity of a first region between the first side and a first reflector is faster than an acoustic wave propagation velocity of a second region between the first side and the second side; and
 a radio frequency circuit element coupled to the filter, the filter and the radio frequency circuit element being enclosed within a common module package.

17. The radio frequency module of claim 16 wherein the radio frequency circuit element is a radio frequency amplifier arranged to amplify a radio frequency signal, or a switch configured to selectively couple the filter to a port of the radio frequency module.

18. A wireless communication device comprising:
 a filter including a surface acoustic wave device having a piezoelectric layer and a vertical stack over the piezoelectric layer, the vertical stack including a first acoustic reflector on the piezoelectric layer, a second acoustic reflector on the piezoelectric layer, and an interdigital transducer electrode on the piezoelectric layer and positioned between the first acoustic reflector and the second acoustic reflector, the interdigital transducer electrode having a first side closer to the first acoustic reflector and a second side closer to the second acoustic reflector, and a vertical arrangement of the vertical stack configured such that an acoustic wave propagation velocity of a first region between the first side and a first reflector is faster than an acoustic wave propagation velocity of a second region between the first side and the second side;
 an antenna operatively coupled to the filter;
 a radio frequency amplifier operatively coupled to the acoustic wave filter and configured to amplify a radio frequency signal; and
 a transceiver in communication with the radio frequency amplifier.

19. The wireless communication device of claim 18 further comprising a baseband processor in communication with the transceiver.

20. The wireless communication device of claim 18 wherein the filter is included in a radio frequency front end, or a diversity receive module.

* * * * *